US010148102B2

United States Patent
Dulle et al.

(10) Patent No.: US 10,148,102 B2
(45) Date of Patent: Dec. 4, 2018

(54) INTEGRATED STRING CONTROL UNIT SYSTEMS AND METHODS

(71) Applicant: Johnson Controls Technology Company, Plymouth, MI (US)

(72) Inventors: Ronald J. Dulle, Mequon, WI (US); Mark D. Gunderson, Bristol, WI (US); Charles S. Tosch, Port Washington, WI (US)

(73) Assignee: Johnson Controls Technology Company, Auburn Hills, MI (US)

( * ) Notice: Subject to any disclaimer, the term of this patent is extended or adjusted under 35 U.S.C. 154(b) by 141 days.

(21) Appl. No.: 15/253,463

(22) Filed: Aug. 31, 2016

(65) Prior Publication Data

US 2017/0123471 A1 May 4, 2017

Related U.S. Application Data

(60) Provisional application No. 62/250,989, filed on Nov. 4, 2015.

(51) Int. Cl.
*H01M 10/42* (2006.01)
*H02J 7/00* (2006.01)
(Continued)

(52) U.S. Cl.
CPC .......... *H02J 7/0031* (2013.01); *B60L 3/0046* (2013.01); *B60L 11/18* (2013.01); *B60L 11/1851* (2013.01);
(Continued)

(58) Field of Classification Search
CPC .................... H01M 10/425; H01M 2010/4271
See application file for complete search history.

(56) References Cited

U.S. PATENT DOCUMENTS 6,150,795 A 11/2000 Kutkut et al.
7,391,184 B2 6/2008 Luo et al.
(Continued)

FOREIGN PATENT DOCUMENTS

CN 203218911 9/2013
WO 2012030455 A2 3/2012

OTHER PUBLICATIONS

PCT International Search Report & Written Opinion for PCT Application No. PCT/US2016/059271 dated Apr. 18, 2017; 20 Pages.

(Continued)

*Primary Examiner* — Albert Wang
(74) *Attorney, Agent, or Firm* — Fletcher Yoder P.C.

(57) ABSTRACT

One embodiment of the present disclosure describes a battery system that includes a battery string with a first and second battery module connected in series; and a battery control system that includes a cell control unit electrically coupled to the first battery module, in which the first cell control unit determines first module level operational parameters related to operation of the first battery module; an integrated string control unit electrically coupled to the second battery module, in which the integrated string control unit determines second module level operational parameters related to operation of the second battery module; determines string level operational parameters related to operation of the battery string based at least in part on the first module level operational parameters and the second module level operational parameters; and controls operation of the battery string based at least in part on the string level operational parameters.

20 Claims, 12 Drawing Sheets

(51) Int. Cl.
*B60L 11/18* (2006.01)
*G06F 1/26* (2006.01)
*G06F 1/32* (2006.01)
*G01R 31/36* (2006.01)
*B60L 3/00* (2006.01)
*H01M 2/10* (2006.01)
*H01M 2/34* (2006.01)
*H01M 10/48* (2006.01)
*G06F 17/50* (2006.01)
*H04L 29/08* (2006.01)

(52) U.S. Cl.
CPC ....... *B60L 11/1861* (2013.01); *B60L 11/1864* (2013.01); *B60L 11/1868* (2013.01); *B60L 11/1877* (2013.01); *B60L 11/1879* (2013.01); *G01R 31/362* (2013.01); *G01R 31/3655* (2013.01); *G01R 31/3658* (2013.01); *G06F 1/266* (2013.01); *G06F 1/3212* (2013.01); *G06F 17/5004* (2013.01); *G06F 17/5095* (2013.01); *H01M 2/1077* (2013.01); *H01M 2/34* (2013.01); *H01M 10/42* (2013.01); *H01M 10/425* (2013.01); *H01M 10/4207* (2013.01); *H01M 10/482* (2013.01); *B60L 2240/54* (2013.01); *B60L 2240/547* (2013.01); *B60L 2240/549* (2013.01); *H01M 2010/4271* (2013.01); *H01M 2220/20* (2013.01); *H04L 67/12* (2013.01); *Y02T 10/7005* (2013.01); *Y02T 10/7044* (2013.01); *Y02T 10/7061* (2013.01); *Y02T 90/16* (2013.01)

(56) References Cited

U.S. PATENT DOCUMENTS

| | | |
|---|---|---|
| 2011/0078470 A1 | 3/2011 | Wang et al. |
| 2011/0144840 A1 | 6/2011 | Ye et al. |
| 2012/0086390 A1 | 4/2012 | Lim et al. |
| 2012/0105001 A1* | 5/2012 | Gallegos ............... B60L 3/0046 320/109 |
| 2012/0313560 A1 | 12/2012 | Hambitzer et al. |
| 2013/0057076 A1* | 3/2013 | Lavender ................. H02J 1/10 307/80 |
| 2013/0234667 A1 | 9/2013 | Norton |
| 2013/0288096 A1 | 10/2013 | Frutschy et al. |
| 2014/0199569 A1 | 7/2014 | Sisk |
| 2014/0372053 A1 | 12/2014 | Lin et al. |

OTHER PUBLICATIONS

Hahnsang Kim et al., DESA: Dependable, Efficient, Scalable Architecture for Management of Large-Scale Batteries, IEEE Transactions on Industrial Informatics, vol. 8, No. 2, May 2012.
NILAR—High voltage energy storage solutions, technical manual, 16 pages.

* cited by examiner

INTEGRATED STRING CONTROL UNIT SYSTEMS AND METHODS

CROSS-REFERENCE TO RELATED APPLICATIONS

This application claims priority from and the benefit of U.S. Provisional Application Ser. No. 62/250,989, entitled "FLEXIBLE SCALABLE BATTERY MANAGEMENT SYSTEM," filed on Nov. 4, 2015, which is incorporated by reference in its entirety for all purposes.

BACKGROUND

The present disclosure generally relates to battery systems and, more specifically, to battery control systems utilized in battery systems.

This section is intended to introduce the reader to various aspects of art that may be related to various aspects of the present disclosure, which are described below. This discussion is believed to be helpful in providing the reader with background information to facilitate a better understanding of the various aspects of the present disclosure. Accordingly, it should be understood that these statements are to be read in this light, and not as admissions of prior art.

Electrical systems often include a battery system to capture (e.g., store) generated electrical energy and/or to supply electrical power. In fact, battery systems may be included in electrical systems utilized for various applications and/or with varying configurations. For example, a stationary power system may include a battery system that receives electrical power output by an electrical generator and stores the electrical power as electrical energy. In this manner, the battery system may supply electrical power to electrical loads using the stored electrical energy.

Additionally, an electrical system in an automotive vehicle may include a battery system that supplies electrical power, for example, to provide and/or supplement the motive force (e.g., power) of the automotive vehicle. For the purpose of the present disclosure, such automotive vehicles are referred to as xEV and may include any one, any variation, and/or any combination of the following type of automotive vehicles. For example, electric vehicles (EVs) may utilize a battery-powered electric propulsion system (e.g., one or more motors) as the primary source of vehicular motive force. As such, a battery system in an electric vehicle may be implemented to supply electrical power to the battery-powered electric propulsion system. Additionally, hybrid electric vehicles (HEVs) may utilize a combination of a battery-powered electric propulsion system and an internal combustion engine propulsion system to produce vehicular motive force. As such, a battery system may be implemented to facilitate directly providing at least a portion of the vehicular motive force by supplying electrical power to the battery-powered electric propulsion system.

Furthermore, micro-hybrid electric vehicles (mHEVs) may use an internal combustion engine propulsion system as the primary source of vehicular motive force, but may utilize the battery system to implement "Stop-Start" techniques. In particular, a mHEV may disable the internal combustion engine when idling and crank (e.g., restart) the internal combustion engine when propulsion is desired. To facilitate implementing such techniques, the battery system may continue supplying electrical power while the internal combustion engine is disabled and supply electrical power to crank the internal combustion engine. In this manner, the battery may system may indirectly supplement providing the vehicular motive force.

In any case, a battery system may include a battery control system that controls (e.g., monitors and/or manages) operation of the battery system. For example, the battery control system may determine operational parameters (e.g., voltage and/or current) of the battery system and instruct the battery system to adjust operation based at least in part on the operational parameters. Thus, implementation of the battery control system may vary based at least in part on implementation (e.g., configuration and/or organization) of the battery system. However, in some instances, implementation of the battery system may vary based at least in part on target application and/or configuration of the electrical system utilizing the battery system.

SUMMARY

Certain embodiments commensurate in scope with the present disclosure are summarized below. These embodiments are not intended to limit the scope of the disclosure, but rather only to provide a brief summary of certain disclosed embodiments. Indeed, the present disclosure may encompass a variety of forms that may be similar to or different from the embodiments set forth below.

The present disclosure generally relates to battery systems, for example, used in an electrical system to capture (e.g., store) electrical energy and/or to supply electrical power using stored electrical energy. In some embodiments, a battery system may include battery control system used to control operation of the battery system. To facilitate controlling operation, a battery control system may perform various functions, such as determining an operational parameter related to operation of the battery system and/or determining a control command instructing the battery system to perform a control action.

In some embodiments, functions to be performed by a battery control system may be dependent on implementation (e.g., hierarchal organization) of the battery system. However, in some instances, implementation of battery systems utilized in different electrical system and/or different target applications may vary. As such, the functions performed by and, thus, implementation of different battery control system may vary.

To facilitate improving implementation flexibility, the present disclosure provides techniques for determining a hybrid battery control system architecture, which may be utilized to implement multiple different battery control system with reduced implementation associated cost. In some embodiments, the hybrid battery control system may include basic (e.g., standard) building blocks that may be used to implement a battery control system. For example, the hybrid battery control system architecture may specify a cell control unit, a string control unit, and a system control unit as well as functions provided by each and infrastructure in each to provide the corresponding functions.

Thus, in some embodiments, a design system may determine the hybrid battery control system architecture based at least in part on target control levels (e.g., granularity) and/or target functions to be provided by battery control systems intended to be compatible (e.g., implementable) using the building blocks provided in the hybrid battery control system architecture. To facilitate determining the target control levels and/or the target functions, in some embodiments, the design system may analyze battery systems corresponding with the battery control systems. In this manner, the design system may determine implementation (e.g., hierarchal organization) of the battery systems.

For example, when a battery system includes a battery module with multiple battery cells, the design system may determine that the target control levels include a cell control level and/or a module control level. Additionally, the design system may determine that the target functions include module level functions, such as determining voltage of the battery module, and/or cell level functions, such as determining voltage of one or more battery cells. Furthermore, when a battery system includes a battery string with multiple battery modules connected in series, the design system may determine that the target control levels include a string control level and the target functions include string level functions, such as determining operational parameters (e.g., voltage or current) of the battery string and/or coordinating operation of the battery modules. Moreover, when a battery system includes multiple battery strings, the design system may determine that the target control levels include a system control level and the target functions include system level functions, such as coordinating operation of the battery strings.

In some instances, a battery control system may be implementable using any one of multiple different battery control system architectures. However, each of the different battery control system architectures may varying effect on implementation flexibility and/or implementation associated cost. Thus, in some embodiments, the design may select the hybrid battery control system architecture from multiple candidates, for example, using an objective function that provides a metric for each candidate indicative of expected implementation flexibility and/or expected implementation associated cost.

In some embodiments, to determine implementation flexibility, the design system may determine a number of different battery control systems and/or number of target functions of the different battery control systems a candidate battery control system architecture is capable of implementing. Additionally, to facilitate determining implementation associated cost, the design system may determine infrastructure used in a candidate battery control system architecture. In some embodiments, implementation associated cost may be reduced by reducing the number of microprocessors, number of isolation barriers, and/or communication infrastructure used to implement a battery control system.

To facilitate improving implementation flexibility and/or reducing implementation associated cost, in some embodiments, the hybrid battery control system architecture determined by the design system may group functions in the building blocks based at least in part on voltage domain and/or control level hierarchy. Additionally, in some embodiments, the hybrid battery control system architecture may distribute less computationally intensive functions, for example, in the cell control units to facilitate improving implementation flexibility. On the other hand, in some embodiments, the hybrid battery control system architecture may centralize more computationally intensive processing functions, for example, in string control units to facilitate reducing number of microprocessors and, thus, implementation associated cost. Furthermore, in some embodiments, the hybrid battery control system architecture may centralize communication between components operating in different voltage domains (e.g., ranges), for example, in string control units to facilitate reducing number of isolation barriers and, thus, implementation associated cost.

Additionally, in some embodiments, the hybrid battery control system architecture may include an integrated string control unit that integrates functionality of a cell control unit and a string control unit. In other words, instead of a separate string control unit and cell control unit, the battery system may be implemented with an integrated string control unit. In this manner, implementing a battery control system using the integrated string control unit, which may facilitate reducing communication infrastructure and, thus, implementation associated cost.

Additionally, in some embodiments, the hybrid battery control system architecture may enable string control units (e.g., integrated string control units) to be communicatively coupled via a serial communication network, for example, using one or more serial communication busses, such as a ripcord bus. In some embodiments, the serial communication network may communicatively couple the string control units in a daisy chain, for example, with a master string control unit and one or more subordinate control units. Utilizing the serial communication network, the string control units may communicate serial communication signals that facilitate self-configuration and/or fault indication.

For example, a master string control unit may generate a serial communication signal with a master frequency (e.g., 100 Hz), which indicates that it is the master string control unit. Additionally, the master string control unit may generate the serial communication signal with a fault frequency to indicate that a fault has been detected. The master string control unit may then communicate the serial communication signal to a subordinate string control unit via a serial communication bus.

Thus, based at least in part on the frequency of the serial communication signal, a subordinate string control unit may determine whether a fault has been detected in the battery system. When a fault has been detected, the subordinate string control unit may output a serial communication signal with the fault frequency to indicate that a fault has been detected. On the other hand, when a fault has not been detected, the subordinate string control unit may determine its order in the serial communication network based at least in part on the received frequency. For example, a string control unit may determine that it is the first subordinate string control unit in the serial communication network when the received frequency is equal to the master frequency.

Additionally, a subordinate string control unit may determine an order frequency that indicates its order in the serial communication network. In some embodiments, the order frequency may be fraction of the received frequency. For example, the order frequency (e.g., 50 Hz) determined by the first subordinate string control unit in the serial communication network may be half the received frequency and, thus, half the master frequency (e.g., 100 Hz). The first subordinate string control unit may then communicate the serial communication signal with the order frequency to a next subordinate string control unit in the serial communication network. In this manner, the next subordinate string control unit may determine that its order in the serial communication network is the second subordinate string control unit.

To facilitate detecting faults, in some embodiments, the hybrid battery control system architecture may provide a cell control unit fault detection capabilities. However, in some embodiments, the hybrid battery control system architecture may include limited processing capabilities in the cell control unit to facilitate reducing implementation associated cost. For example, instead of a microprocessor, the cell control unit may include a first analog-to-digital (ADC) converter, a second analog-to-digital converter, and logic circuitry, which performs logic operations and/or arithmetic operations based on circuit connections formed in the logic circuitry.

Thus, to improve reliability of the battery system, the cell control unit may be implemented to provide fault detection even with limited processing capabilities. For example, in some embodiments, the first analog-to-digital converter may receive sensor data (e.g., analog representation) from a voltage sensor and generate a first cell group voltage (e.g., digital representation) that indicates voltage measured across a first cell group in a battery module. Additionally, the second analog-to-digital converter may receive sensor data from a voltage sensor and generate a second cell group voltage that indicates voltage measured across a second cell group in the battery module. Furthermore, the second analog-to-digital converter may receive sensor data from a voltage sensor and generate a measured cell group voltage (e.g., digital representation) that indicate voltage measured across the battery module.

Based at least in part on the first cell group voltage and the second cell group voltage, the logic circuitry may determine a calculated battery module voltage, for example, by summing the first cell group voltage and the second cell group voltage. Additionally, to determine whether a fault is expected to be present, the logic circuitry may compare the calculated battery module voltage with the measured battery module voltage. For example, in some embodiments, the logic circuitry may determine that that a fault is expected to be present when a voltage difference between the calculated battery module voltage and the measured battery module voltage is greater than a difference threshold. In this manner, a hybrid battery control system architecture that improves implementation flexibility and/or reduces implementation associated cost may be determined and used to implement various battery control systems.

DRAWINGS

These and other features, aspects, and advantages of the present disclosure will become better understood when the following detailed description is read with reference to the accompanying drawings in which like characters represent like parts throughout the drawings, wherein.

DETAILED DESCRIPTION

Figure 1:
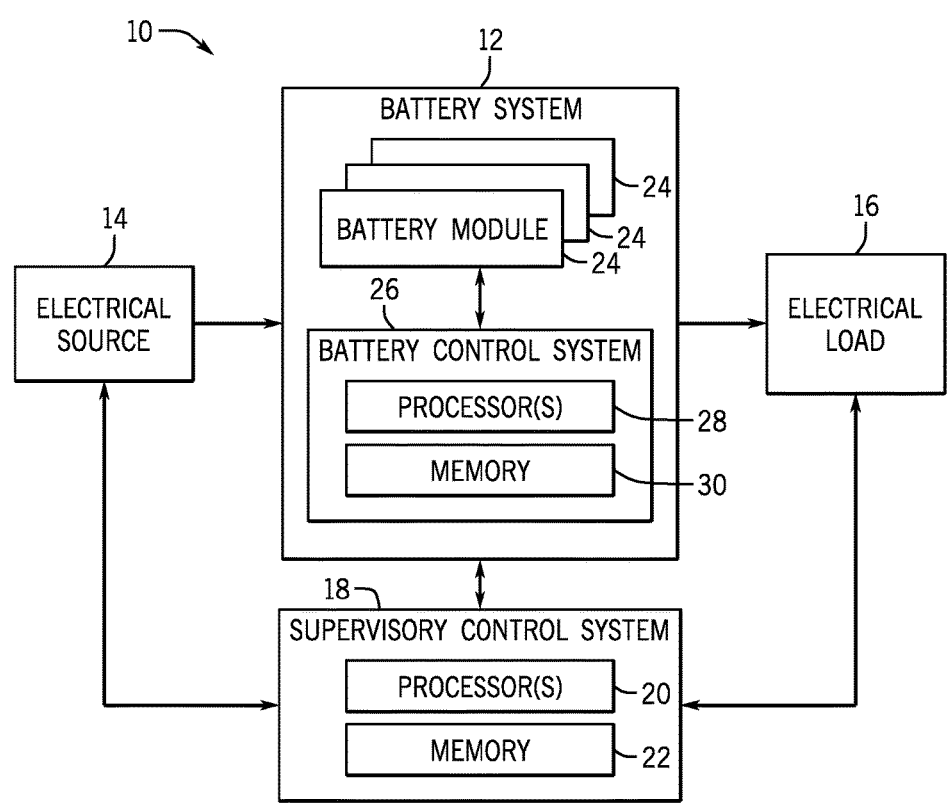
FIG. 1 is block diagram of an electrical system including a battery system, in accordance with an embodiment of the present disclosure.

One or more specific embodiments of the present disclosure will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of the present disclosure.

Generally, a battery systems may be implemented to capture (e.g., store) electrical energy generated by one or more electrical generators and/or to supply electrical power to one or more electrical loads using stored electrical energy. Leveraging these benefits, one or more battery system are often included in an electrical system. In fact, battery system may be utilized in electrical systems with varying configurations to implement a wide-variety of target applications, for example, ranging from a stationary power system to a vehicular electrical system.

To facilitate implementing different target applications, the configuration of an electrical system and, thus, the battery system used in the electrical system may be adjusted. For example, in one target application, the electrical system may include a first electrical load (e.g., component) designed to operate using electrical power in a high (e.g., 48V, 600V, or 720V) voltage domain and a second electrical load that operates using electrical power in a low (e.g., 3V, 5V, or 12V) voltage domain. As such, the battery system may be implemented to supply electrical power to the first electrical load in the high voltage domain.

In some embodiments, to facilitate providing the high voltage domain, the battery system may be implemented with multiple battery modules (e.g., packs) connected in series as one or more battery strings. Additionally, to facilitate provide providing sufficient electrical power to operate the first electrical load, in some embodiments, the battery system may be implemented with multiple battery modules and/or multiple battery strings connected in parallel. Furthermore, the battery system and/or an external power source may be implemented to supply electrical power to the second electrical load in the low voltage domain.

To control operation (e.g., storage of electrical energy and/or supply of electrical power), a battery system may include a battery control system. In particular, the battery control system may control operation of the battery system by performing various functions, such as determining operational parameters (e.g., voltage, current, and/or temperature) related to operation of the battery system, communicating the operational parameters within the battery control system, communicating the operational parameters to an external communication network, and/or determining control commands instructing the battery system to perform control actions. For example, the battery control system may determine operational parameters of one or more battery cells in a battery module, one or more battery modules, one or more battery strings, and/or the battery system as a whole. Additionally, the battery control system may communicate the operational parameters to a supervisory control system that coordinates operation of sub-systems in the electrical system. Furthermore, the battery control system may communicate a control command instructing a relay (e.g., circuit breaker) to open when a fault is detected.

In some instances, the functions to be provided by a battery control system may be dependent on implementation (e.g., hierarchal organization) of the corresponding battery system. However, as described above, implementation of the battery system may vary when utilized in different electrical system and/or in different target applications. In other words, battery control system used in different battery systems may vary in implementation, such as in provided functions and/or control levels (e.g., granularity).

In some embodiments, a battery control system may be implemented using a battery control system architecture. For example, a purely centralized battery control system architecture may be designed for a specific battery control system and, thus, limit implementation flexibility (e.g., number of compatible battery system variations). On the other extreme, a purely distributed battery control system architecture may increase amount of redundant infrastructure to improve implementation flexibility, but result in increased implementation associated cost.

Accordingly, the present disclosure provides techniques for determining a hybrid battery control system architecture, for example, that improves implementation flexibility and/or reduce implementation associated cost. In some embodiments, the hybrid battery control system may include basic (e.g., standard) building blocks that may be used to implement a battery control system. For example, the hybrid battery control system architecture may provide a cell control unit with specific infrastructure to provide specific cell level functions and/or module level functions. Additionally, the hybrid battery control system architecture may provide a string control unit with specific infrastructure to provide specific string level functions. Furthermore, the hybrid battery control system architecture may provide a system control unit with specific infrastructure to provide specific system level functions.

In some embodiments, a design system may determine the hybrid battery control system architecture based at least in part on target control levels (e.g., granularity) and/or target functions to be provided by battery control systems intended to be implementable using the building blocks provided in the hybrid battery control system architecture. Additionally, in some embodiments, the design system may determine the hybrid battery control system architecture based at least in part on infrastructure (e.g., processing, power, and/or communication infrastructure) expected to be used to implement the target functions.

To facilitate determining the hybrid battery control system architecture, in some embodiments, the design system may analyze multiple candidates using an objective function. In some embodiments, the objective function may provide a metric associated with a candidate indicative of expected implementation flexibility and/or expected implementation associated cost. For example, in some embodiments, the objection function may target reducing number of processors, reducing number of isolation barriers, and/or reducing communication infrastructure. In this manner, the design system may select the hybrid battery control system architecture from the multiple candidates.

In some embodiments, the hybrid battery control system architecture may group functions in the various building blocks based at least in part on voltage domain and/or control level hierarchy. For example, the hybrid battery control system architecture may group measurement functions related to a battery module and/or battery cells in the battery module in a cell control unit. Additionally, in some embodiments, the hybrid battery control system architecture may centralize external (e.g., from the battery control system) communication functions in a system control unit, thereby reducing communication infrastructure utilized to implement the external communication functions.

Furthermore, in some embodiments, the hybrid battery control system architecture may centralize more computationally intensive processing functions in one building block. For example, the hybrid battery control system architecture may centralize more computationally intensive processing functions in a string control unit, thereby reducing processing infrastructure utilized to implement the processing functions. On the other hand, the hybrid battery control system architecture may distribute less computationally intensive functions between multiple different building blocks. For example, the hybrid battery control system architecture may distribute less computationally intensive processing functions between a cell control unit, a string control unit, and a system control unit, thereby improving implementation flexibility by providing multiple different control levels (e.g., granularity).

Additionally, in some embodiments, the hybrid battery control system architecture may centralize (e.g., within the battery control system) communication functions between components operating in different voltage domains in one building block. For example, the hybrid battery control system architecture may centralize communication between electrical components operating in different voltage domains in a string control unit. In this manner, other building blocks may be implemented without isolation barriers, thereby reducing power infrastructure used to implement communication functions.

As described above, a battery string may include one or more battery modules connected in series. In other words, a battery string generally includes at least one battery module. Thus, in some embodiments, the hybrid battery control system architecture may include an integrated string control unit that integrates functionality of a cell control unit and a string control unit. In other words, instead of a separate string control unit and cell control unit, the battery system may include a single integrated string control unit. In this manner, the hybrid battery control system architecture may facilitate reducing communication infrastructure—particularly in less complex battery system (e.g., single battery module battery strings). In fact, in some embodiments, using an integrated string control unit may obviate using a system control unit, for example, in battery systems with a single battery module and/or a single battery string.

In some embodiments, string control units (e.g., integrated string control units) may be communicatively coupled by a parallel (e.g., primary) communication network, such as a Controller Area Network (CAN). To improve reliability of a battery control system, the string control units may also be communicatively via a serial (e.g., backup) communication network via one or more serial communication busses, such as a ripcord bus. In some embodiments, the serial communication network may communicatively couple the string control units in a daisy chain, for example, with a master (e.g., first) string control unit and one or more subordinate (e.g., second) control units.

Additionally, in some embodiments, the serial communication network may enable the string control units to communicate serial communication signals used to facilitate self-configuration and/or fault indication. In some embodiments, a string control unit may generate a serial communication signal with a frequency that indicates its order in the serial communication network and/or whether a fault has been detected in the battery system. For example, when a fault has not been detected, a first string control unit may generate a serial communication signal with a master frequency, which indicates that it is the master string control unit. On the other hand, when a fault has been detected, the first string control unit may generate the serial communication signal with a fault frequency, which indicates that a fault has been detected in the battery system.

By outputting the serial communication signal to a serial communication bus, a string control unit may enable a subsequent string control unit in the serial communication network to determine that the fault has been detected. For example, when a second string control unit receives a serial communication signal with the fault frequency from the first string control unit, the second string control unit may confirm that a fault has been detected and output a serial communication signal with the fault frequency after the fault has been confirmed to indicate that a fault has been detected in the battery system.

Additionally, by outputting the serial communication signal to a serial communication bus, a string control unit may enable a subordinate string control unit to determine its order in the serial communication network. For example, when the second string control unit receives a serial communication signal with the master frequency from the first string control unit, the second string control unit may determine that the first string control unit is the master string control unit and, thus, it is the first subordinate string control unit in the serial communication network.

The subordinate string control unit may also determine an order frequency that indicates its order in the serial communication network. In some embodiments, the order frequency may be fraction of the received frequency. For example, the order frequency determined by the second string control unit may be half the received frequency and, thus, half the master frequency. Thus, by communicating a serial communication signal with its order frequency to a third string control unit in the serial communication network, the string control unit may enable the third string control unit to determine that it is the second subordinate string control unit in the serial communication network.

As described above, a string control unit may determine whether a fault is expected to have occurred in the string control unit, cell control units communicatively coupled to the cell control unit, and/or battery modules electrically coupled to the cell control units. Additionally, as described above, the hybrid battery control system architecture may centralize computationally intensive functions in a string control unit. Thus, in some embodiments, a string control unit may include a processor (e.g., a processor unit and/or processing circuitry), which may enable the string control unit to execute more complex data analysis operations to detect faults.

On the other hand, in some embodiments, the hybrid battery control system architecture may provide a cell control unit with limited processing capabilities to facilitate reducing implementation associated cost. However, this may limit complexity of data analysis operations the cell control unit is capable of executing. For example, instead of a processor, a cell control may include a first analog-to-digital (ADC) converter, which determines an indication of operational parameters (e.g., voltage) of a first battery cell group in a battery module, a second analog-to-digital converter, which determines an indication representation of operation of operational parameters of a second battery cell group in the battery module and of the battery modules as a whole, and logic circuitry.

In some embodiments, the logic circuitry may perform logic operations and/or arithmetic operations based on circuit connections formed in the logic circuitry. For example, the logic circuitry may include arithmetic circuitry, such as one or more logic gates. Additionally, the logic circuitry may include comparison circuitry, such as one or more operational amplifiers. Thus, in some embodiments, the processing capabilities of the logic circuitry may be more limited compared to a processor.

Nevertheless, the hybrid battery control system architecture may enable the cell control units to be implemented with fault detection capabilities. For example, the first analog-to-digital converter may determine an indication (e.g., digital representation) of the first battery cell group voltage. Additionally, the second analog-to-digital converter may determine an indication of the second battery cell group voltage as well as a first indication of the battery module voltage. Based at least in part on the first battery cell group voltage and the second battery cell group voltage, the logic circuitry may determine a second indication of the battery module voltage. Additionally, the logic circuitry may compare the first indication of the battery module voltage with the second indication of the battery module voltage to determine whether a fault is expected to be present in the cell control unit. For example, the logic circuitry may determine that a fault is expected to be present when the two vary by more than a threshold (e.g., voltage or percentage). In this manner, a hybrid battery control system architecture that improves implementation flexibility and/or reduces implementation associated cost may be determined and used to implement various battery control systems.

To help illustrate, an electrical system 10 including a battery system 12 is shown in FIG. 1. In addition to the battery system 12, the electrical system 10 also includes an electrical source 14, an electrical load 16, and a supervisory control system 18. In some embodiments, the supervisory control system 18 may control operation of the electrical system 10. For example, the supervisory control system 18 may determine operational parameters of and/or coordinate operation of sub-systems (e.g., the battery system 12, the electrical source 14, and/or the electrical load 16) in the electrical system 10.

To facilitate controlling operation, the supervisory control system 18 may include a supervisory processor 20 and supervisory memory 22. In some embodiments, the supervisory memory 22 may include a tangible, non-transitory, computer readable medium that stores instructions executable by the supervisory processor 20. Thus, in such embodiments, the supervisory memory 22 may include random access memory (RAM), read only memory (ROM), rewritable non-volatile memory (e.g., flash memory), hard drives, optical discs, and the like. Additionally, the supervisory processor 20 may include one or more general purpose processing units and/or processing circuitry. For example, the supervisory processor 20 may include one or more microprocessors, one or more application-specific integrated circuits (ASICs), and/or one or more field programmable logic arrays (FPGAs).

As described above, the battery system 12 may store received electrical power as electrical energy and supply electrical power using the stored electrical energy. Thus, as depicted the battery system 12 is electrically connected to the electrical source 14, which may enable the electrical source 14 to supply electrical power to the battery system 12. In some embodiments, the electrical source 14 may include one or more machines, components, and/or devices that output electrical power. For example, the electrical source 14 may be a power grid, an electrical generator, an alternator, an energy storage system (e.g., another battery system), or the like.

Additionally, as depicted, the battery system 12 is electrically connected to the electrical load 16, which may enable the battery system 12 to supply electrical power to the electrical load 16. In some embodiments, the electrical load 16 may include one or more machines, components, and/or devices that use the electrical power to perform operations and/or capture the electrical power as electrical energy. For example, the electrical load 16 may include a computer, an engine control unit, a display, a light bulb, an electrical motor, an energy storage system (e.g., another battery system), a heating, ventilating, and air conditioning (HVAC) system, or the like.

In the depicted embodiment, the battery system 12 includes one or more battery modules 24 and a battery control system 26. In some embodiments, the battery control system 26 may control operation of the battery system 12. For example, the battery control system 26 may determine operational parameters of battery modules 24, coordinate operation of multiple battery modules 24, communicate control commands instructing the battery system 12 to perform control actions, and/or communicate with the supervisory control system 18.

To facilitate controlling operation, the battery control system 26 may include a processor 28 and memory 30. In some embodiments, the memory 30 may include a tangible, non-transitory, computer readable medium that stores data, such as instructions executable by the processor 28, results (e.g., operational parameters) determined by the processor 28, and/or information (e.g., operational parameters) to be analyzed/processed by the processor 28. Thus, in such embodiments, the memory 30 may include random access memory (RAM), read only memory (ROM), rewritable non-volatile memory (e.g., flash memory), hard drives, optical discs, and the like. Additionally, the processor 28 may include one or more general purpose processing units, processing circuitry, and/or logic circuitry. For example, the processor 28 may include one or more microprocessors, one or more application-specific integrated circuits (ASICs), and/or one or more field programmable logic arrays (FPGAs).

Additionally, to facilitate storing electrical energy and supplying electrical power, the battery system 12 may include one or more battery modules 24. In some embodiments, storage capacity of the battery system 12 may be based at least in part on number of battery modules 24. Additionally, in some embodiments, operational compatibility of the battery system 12 with the electrical system 10 may be based at least in part on configuration of the battery modules 24, for example, in series and/or in parallel to operate in a target voltage domain. According, in some embodiments, implementation (e.g., number and/or configuration) of the battery modules 24 and, thus, the battery system 12 may vary based at least in part on configuration and/or target application of the electrical system 10.

However, as described above, electrical systems 10 may be utilized in a wide-range of applications. As such, implementation of different battery system 12 may vary from one another. For example, in some embodiments, the electrical system 10 may be included in a stationary power system, an industrial system, a manufacturing system, an automation system, or the like, such as a factory or plant. Additionally, in some embodiments, the electrical system 10 may be included in a computing system, such as a computer, or an automotive system, such as an automotive vehicle (e.g., airplane, boat, truck, or car).

Figure 2:
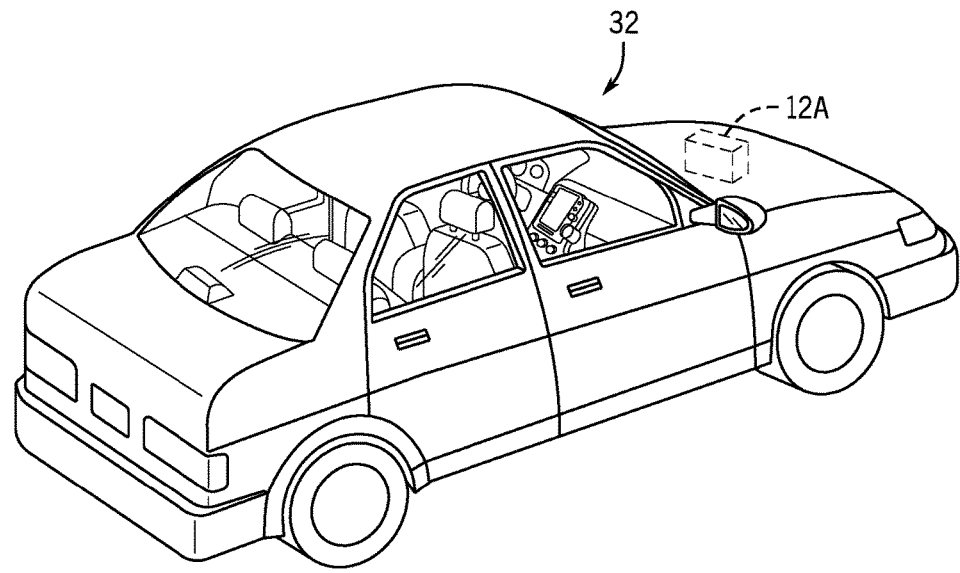
FIG. 2 is a perspective view of an automotive vehicle with the electrical system battery system of claim 1, in accordance with an embodiment of the present disclosure.

To provide an example of a possible application, an automotive vehicle 32 utilizing a first battery system 12A is shown in FIG. 2. Discussion with regard to the automotive vehicle 32 is merely intended to be help illustrate the techniques of the present disclosure and not to limit scope of the techniques. In some embodiments, the automotive vehicle 32 may be an xEV, which utilizes the battery system 12 to provide and/or supplement vehicular motive force, for example, used to accelerate and/or decelerate the automotive vehicle 32. In other embodiments, the automotive vehicle 32 may be a traditional automotive vehicle 32 that produces vehicular motive force, for example, using an internal combustion engine to accelerate and/or frictional brakes to decelerate.

Figure 3:
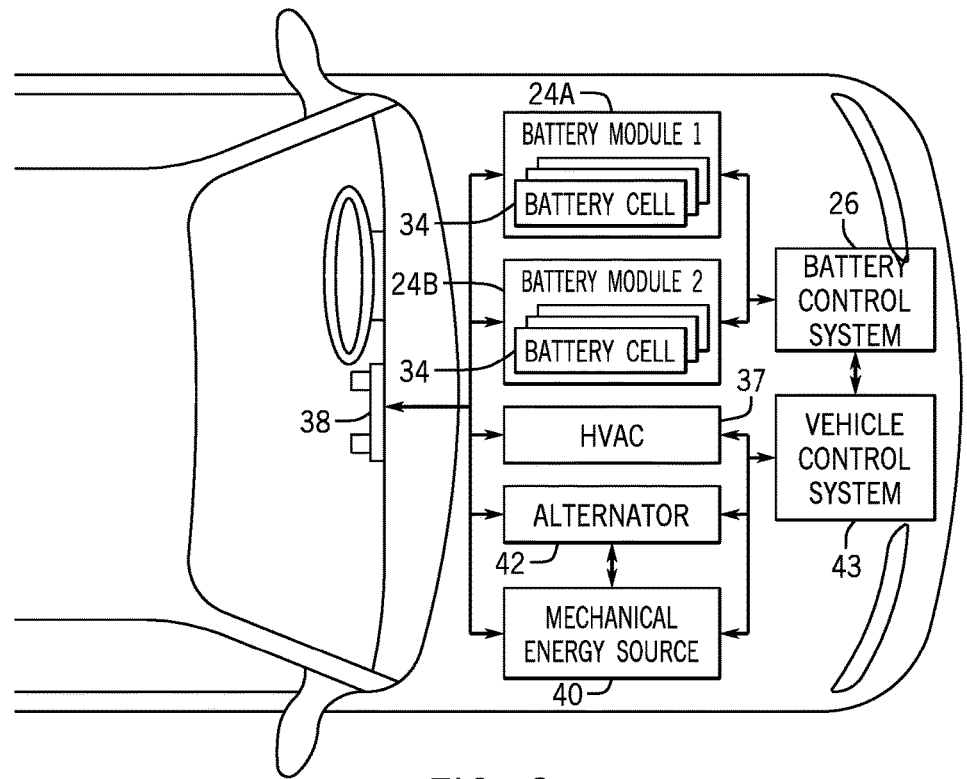
FIG. 3 is a schematic diagram of the automotive vehicle of FIG. 2, in accordance with an embodiment of the present disclosure.

A more detailed view of the first battery system 12A and the electrical system 10 in the automotive vehicle 32 is shown in FIG. 3. As described above, the battery system 12 includes the battery control system 26 and one or more battery modules 24. Additionally, as described above, an electrical system 10 may include an electrical source 14, an electrical load 16, and a supervisory control system 18 in addition the battery system 12. For example, in the depicted automotive vehicle 32, the electrical load 16 may include a vehicle console 38 and a heating, ventilating, and air conditioning (HVAC) system 37. In some embodiments, the electrical load 16 may additional or alternatively include a mechanical energy source 40 (e.g., an electric motor) operating in a motor mode.

Additionally, in the depicted automotive vehicle 32, the electrical source 14 includes an alternator 42, which may convert mechanical energy generated by the mechanical energy source 40 (e.g., an internal combustion engine and/or rotating wheels) into electrical energy. In some embodiments, the electrical source 14 may additionally or alternatively include the mechanical energy source 40 (e.g., an electric motor) operating in a generator mode.

As depicted, the automotive vehicle 32 also includes a vehicle control system 43. In some embodiments, the vehicle control system 43 may generally control operation of the automotive vehicle 32, which includes the electrical system 10. Thus, in the depicted automotive vehicle 32, the supervisory control system 18 may be included in a vehicle control system 43. However, the vehicle control system 43 may additionally control operation of other components other that the electrical system 10, such as an internal combustion engine propulsion system.

As described above, the number and/or configuration of battery modules 24 in different battery systems 12 may vary based at least in part on target application. For example, in the depicted automotive vehicle 32, the battery system 12 includes two battery modules 24—namely a first battery module 24A and a second battery module 24B. In some embodiments, the first battery module 24A may include one or more battery cells 36 connected in series and/or in parallel with terminals of the first battery module 24A. Similarly, in some embodiments, the second battery module 24B may include one or more battery cells 36 connected in series and/or in parallel with terminals of the second battery modules 24B.

In some embodiments, a battery system 12 may include multiple battery modules 24 to facilitate operational compatibility with multiple voltage domains. For example, in the depicted embodiment, the first battery module 24A may operate (e.g., receive and/or supply) using electrical power in a first (e.g., high or 48 volt) voltage domain. On the other hand, the second battery module 24B may operate using electrical power in a second (e.g., low or 12 volt) voltage domain.

Additionally or alternatively, in some embodiments, a battery system 12 may include multiple battery modules 24 to improve implementation flexibility and/or implementation ease. For example, when the first battery module 24A and the second battery module 24B are connected in series, a single battery module 24 may instead be used. However, such a battery module 24 may be large, heavy, and/or produce a higher voltage at its terminals, thereby limiting ease of moving the battery module 24. Additionally, such a battery module 24 may limit implementation flexibility, for example, in another battery system 12 with the first battery module 24A and the second battery module 24B instead connected in parallel.

Figure 4:
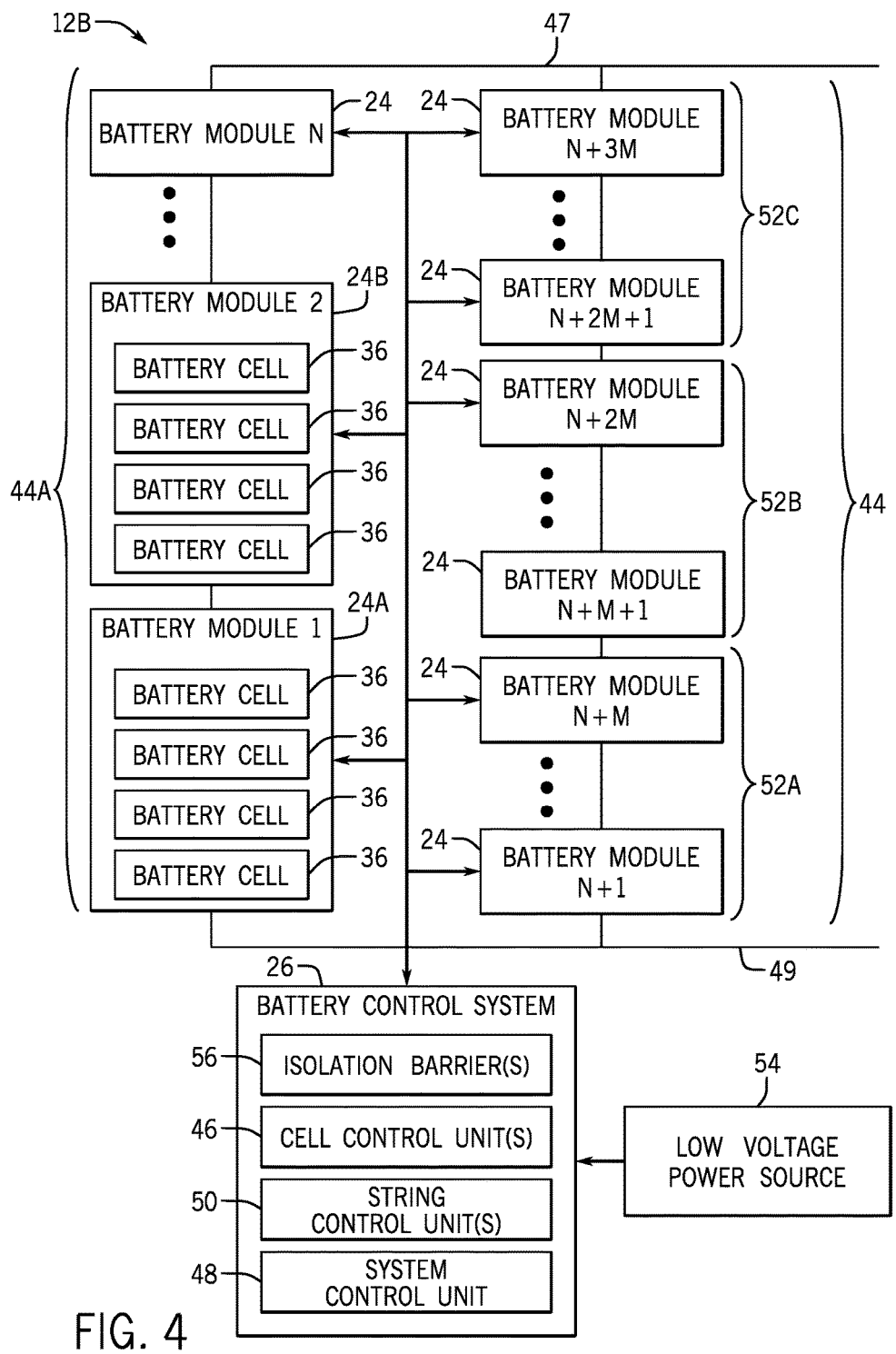
FIG. 4 is a block diagram of the battery system of FIG. 1 including a battery control system, in accordance with an embodiment of the present disclosure.

Comparatively, FIG. 4 shows a second battery system 12B utilized in a different application, such as a stationary power system. As depicted, the second battery system 12B include a number of battery modules 24 in addition to the first battery module 24A and the second battery module 24B. In particular, the depicted battery system 12 includes multiple battery chains 44, which each includes multiple battery modules 24 connected in series, connected in parallel between a positive bus 47 and a negative bus 49. For example, a first battery chain 44A includes N number of battery modules 24 connected in series. In some embodiments, each battery module 24 may be intended to be electrically identical and, thus, each battery chain 44 may include the same number of battery modules 24.

Due at least in part to the different number of battery modules 24, the battery control system 26 utilized in the first battery system 12A and the battery control system 26 utilized in the second battery system 12B may be different. For example, instead of merely coordinating operation of the first battery module 24A and the second battery module 24B, the battery control system 26 in the second battery system 12B may coordinate operation of multiple battery chains 44. In other words, different battery control system 26 may perform different control functions—particularly when used in different applications.

To help account for the different control functions, a battery control system 26 may be implemented based at least in part on a battery control system architecture. Generally, multiple different battery control system architectures may be capable of implementing a battery control system 26. However, the multiple different battery control system architectures may have varying effects on implementation flexibility and/or implementation associated cost.

For example, it may be possible to implement a battery system 12 using a purely centralized battery control system architecture specifically designed for the battery control system 26. Since specifically designed for the battery system 12, the purely centralized battery control system architecture may reduce amount of redundant infrastructure, thereby reducing implementation associated cost. However, the purely centralized battery control system architecture is generally unique to the battery control system 26, thereby limiting implementation flexibility (e.g., number of compatible battery system variations).

On the other extreme, it may be possible to implement a battery control system 26 using a purely distributed battery control system architecture, which provides a basic building block for each potential control function that may be implemented in a battery system 12. In this manner, the building blocks in the purely distributed battery control system architecture may be used to implement a wide variety of battery control system 26, thereby improving implementation flexibility. However, the purely distributed battery control system architecture may result in increasing amount of redundant infrastructure. For example, since each building block may communicate with another building block, increasing number of building blocks may increase communication infrastructure (e.g., communication interfaces and/or busses) used to implement a battery control system 26, thereby increasing implementation associated cost.

Leveraging advantages of the two extremes, in some embodiments, a hybrid battery control system architecture may be used to implement battery control system 26 with improved implementation flexibility and/or reduced implementation associated cost. In particular, a hybrid battery control system architecture may provide basic building blocks that each provides different levels (e.g., abstractions or granularity) of control. For example, the basic building blocks may include a cell control unit 46 that provides battery module level and/or battery cell level control functions. Additionally, the basic building blocks may include a system control unit 48 that provides battery system level control functions.

Furthermore, the basic building blocks may include a string control unit 50 that provides battery string level control functions. As used herein, a battery string is intended to describe one or more battery modules 24 connected in series. Thus, a battery chain 44 may include one or more battery strings 52. In some embodiments, a battery chain 44 may be divided into multiple battery strings 52 to facilitate maintaining control granularity without significantly increasing control complexity. For example, in the depicted embodiment, a battery chain 44 is divided into three M number of battery modules 24—namely a first battery string 52A, a second battery string 52B, and a third battery string 52C.

Moreover, a hybrid battery control system architecture may provide infrastructure used in each of the building blocks. For example, a hybrid battery control system architecture may specify processing infrastructure, power infrastructure, and/or communication infrastructure included in each of the cell control unit 46, the system control unit 48, and the string control unit 50. In some embodiments, the processing infrastructure may indicate one or more processor units, processing circuitry, and/or logic circuitry used in a building block. Additionally, the communication infrastructure may indicate one or more communication interfaces used in a building block.

Furthermore, the power infrastructure may indicate one or more isolation barrier 56 used in and/or target operating voltage domain of a building block. As described above, a battery system 12 may operate in multiple different voltage domains. For example, in the depicted embodiment, the battery modules 24 may operate in a high voltage domain. Thus, the battery modules 24 may act as a high voltage power source that supplies electrical power to electrical components designed to operate using electrical power in the high voltage domain, which may include a portion of the battery control system 26. However, another portion of the battery control system 26 may be designed to operate using electrical power in a low voltage domain and, thus, receive electrical power from a low (e.g., external) voltage power source 54.

Due to different portions operating in different voltage domains, the battery control system 26 may include one or more isolation barriers 56. In particular, an isolation barrier 56 may electrically isolate electrical components operating in a first (e.g., high) voltage domain and electrical components operating in a second (e.g., low) voltage domain. Additionally, in some embodiments, an isolation barrier 56 may electrically isolate the battery system 12 from a common ground (e.g., system ground), such as a vehicle chassis or a device housing.

In this manner, a battery control system 26 may be implemented using the building blocks specified in a hybrid battery control system architecture, for example, based at least in part on target functions to be provided by the battery control system 26 and functions provided by each of the building blocks. However, in some instances, multiple different hybrid battery control system architectures may be expected to enable implementing a battery control system 26. Moreover, in some instances, the multiple different hybrid battery control system architectures may each have varying effects on implementation flexibility and/or implementation associated cost.

In other words, determining an appropriate hybrid battery control system architecture may be a complex process. Thus, in some embodiments, a design system may be used to facilitate determining a hybrid battery control system architecture used to implement battery control system 26, for example, by selecting the hybrid battery control system architecture from multiple candidates based on various factors.

Design System for Hybrid Battery Control System Architecture

Figure 5:
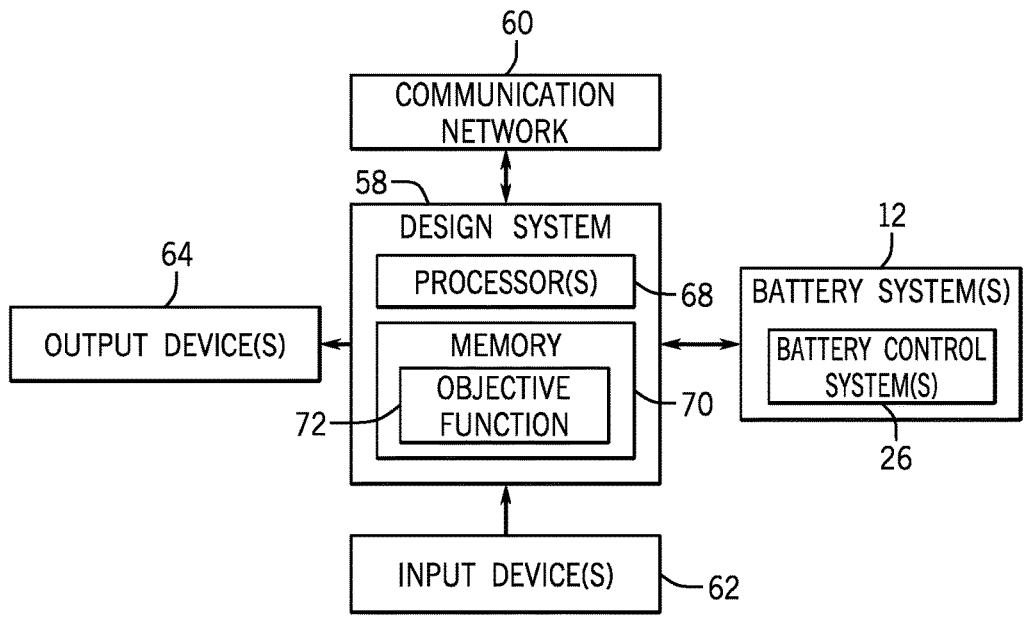
FIG. 5 is a block diagram of a design system used to determine a target architecture of the battery control system of FIG. 4, in accordance with an embodiment of the present disclosure.

To help illustrate, one embodiment of a design system 58 that may be used to determine a hybrid battery control system architecture is shown in FIG. 5. In the depicted embodiment, the design system 58 is communicatively coupled to one or more battery systems 12, a communication network 60, one or more input devices 62, and one or more output devices 64. It should be appreciated that the depicted embodiment is merely intended to be illustrative of components that may be communicatively coupled to the design system 58. For example, in other embodiments, the design system 58 may be communicatively coupled to any combination of the battery system 12, the communication network 60, input devices 62, and output devices 64.

In any case, the communication network 60, the input devices 62, and/or the output devices 64 may facilitate communication to and/or communication from the design system 58. For example, the communication network 60 may enable the design system 58 to communicate with other electronic devices. Thus, in some embodiments, the communication network 60 may be a personal area network (PAN), such as a Bluetooth network, a local area network (LAN), such as an 802.11x Wi-Fi network, a wide area network (WAN), such as a 4G or LTE cellular network, a controller area network (CAN), and/or a local interconnect network (LIN).

Additionally, the input devices 62 may facilitate user interaction with the design system 58, for example, by receiving user inputs. Thus, in some embodiments, the input devices 62 may include a button, a keyboard, a mouse, a trackpad, and/or the like. Furthermore, the output device 62 may facilitate user interaction with the design system 58, for example, by indicating determined information. Thus, in some embodiments, the output device 64 may include an electronic display, a speaker, and/or the like.

To facilitate determining the hybrid battery control system architecture, the design system may include a design processor 68 and design memory 70. In some embodiments, the design memory 70 may include a tangible, non-transitory, computer readable medium that stores instructions executable by the design processor 68. Thus, in such embodiments, the design memory 70 may include random access memory (RAM), read only memory (ROM), rewritable non-volatile memory (e.g., flash memory), hard drives, optical discs, and the like. Additionally, the design processor 68 may include one or more general purpose processing units, processing circuitry, and/or logic circuitry. For example, the design processor 68 may include one or more microprocessors, one or more application-specific integrated circuits (ASICs), and/or one or more field programmable logic arrays (FPGAs).

As described above, the design system 58 may determine the hybrid battery control system architecture by selecting from multiple candidates based on various factors, such as implementation flexibility and/or implementation associated cost. In some embodiments, the design system 58 may analyze the multiple candidates based at least in part on an objective function 72. In particular, the objective function 72 may indicate a metric that takes into account expected ability of a candidate to achieve the various factors. Thus, in some embodiments, the design system 58 may store the objective function 72 in the design memory 70, receive the objective function via the input devices 62, and/or receive the objective function via the communication network 60. Additionally, in some embodiments, the design system 58 may indicate the determined hybrid battery control system via the output devices 64 and/or the communication network 60 to facilitate implementing a battery control system 26 using the hybrid battery control system.

Furthermore, in some embodiments, the design system 58 may receive one or more of the candidates via the communication network 60 and/or the inputs device 62. Additionally or alternatively, the design system 58 may determine one or more of the candidate via analysis of one or more battery systems 12 and/or battery control systems 26 the hybrid battery control system architecture is intended to be compatible with. For example, in some embodiments, the design system 58 may determine a candidate based at least in part on target control levels that may be implemented in the battery control systems 26, target functions to be provided by the battery control system 26, and/or infrastructure used to implement each target function.

Figure 6:
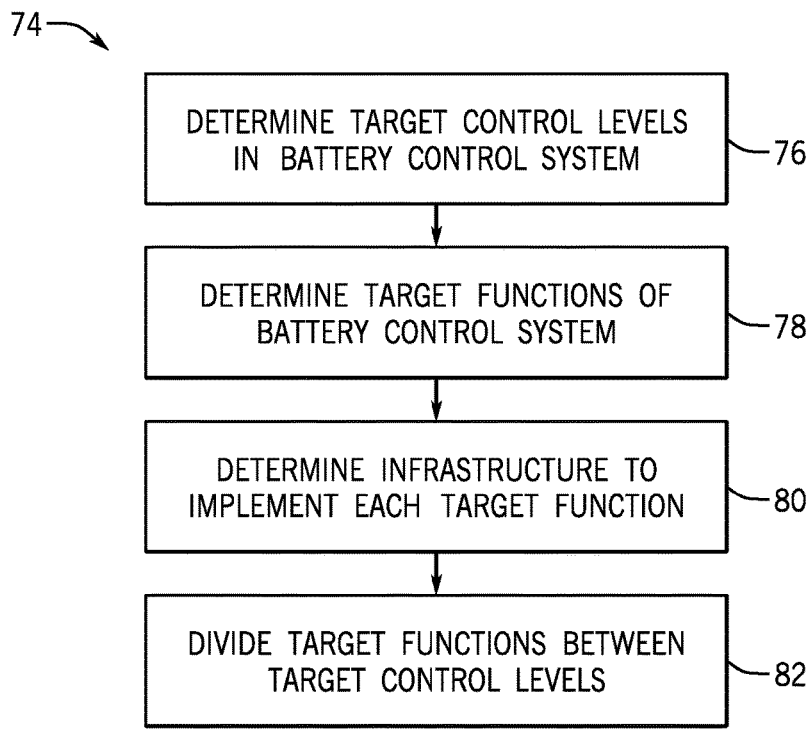
FIG. 6 is a flow diagram of a process for operating the design system of FIG. 6, in accordance with an embodiment of the present disclosure.

To help illustrate, one embodiment of a process 74 for determining a hybrid battery control system architecture is described in FIG. 6. Generally, the process 74 includes determining target control levels in a battery control system (process block 76), determining target functions of the battery control system (process block 78), determining infrastructure to implement each of the target functions (process block 80), and dividing the target functions between the control levels (process block 82). In some embodiments, the process 74 may be implemented by executing instructions stored in a tangible, non-transitory, computer-readable medium, such as the design memory 70, using a processor, such as the design processor 68.

Accordingly, in some embodiments, the design system 58 may determine target control levels in battery control systems 26 intended to be implementable using the hybrid battery control system architecture (process block 76) and target functions to be provided at each of the target control levels (process block 78). In some embodiments, the design system 58 may receive the target control levels and/or the target functions from the communication network 60 and/or the input devices 62, for example, based on manual user input. Additionally or alternatively, to facilitate determining the target control level and/or the target functions, the design system 58 may analyze battery systems 12 in which the battery control systems 26 are used. By analyzing a battery system 12, the design system 58 may determine implementation (e.g., hierarchal organization) of the battery system 12.

For example, by analyzing the second battery system 12B of FIG. 4, the design system 58 may determine number and/or target operating parameters of the battery cells 36, the battery modules 24, the battery strings 52, and/or the battery chains 44 in the second battery system 12B. In particular, the design system 58 may determine that the second battery system 12B is implemented with battery modules 24 each including a specific number (e.g., four or sixteen) battery cells 36. Additionally, the design system 58 may determine that the second battery system 12B is implemented with a specific number (e.g., three) battery strings 52 per battery chain 44.

Based at least in part on the implementation of the battery system 12, the design system 58 may determine control levels that may be used in a battery control system 26 of the battery system 12. For example, with regard to the second battery system 12B of FIG. 4, the design system 58 may determine that a battery control system 26 may provide a cell control level, a module control level, a string control level, and/or system control level. Additionally, based at least in part on the implementation of the battery system 12, the design system 58 may determine target functions to be provided at each of the control levels.

Figure 7:
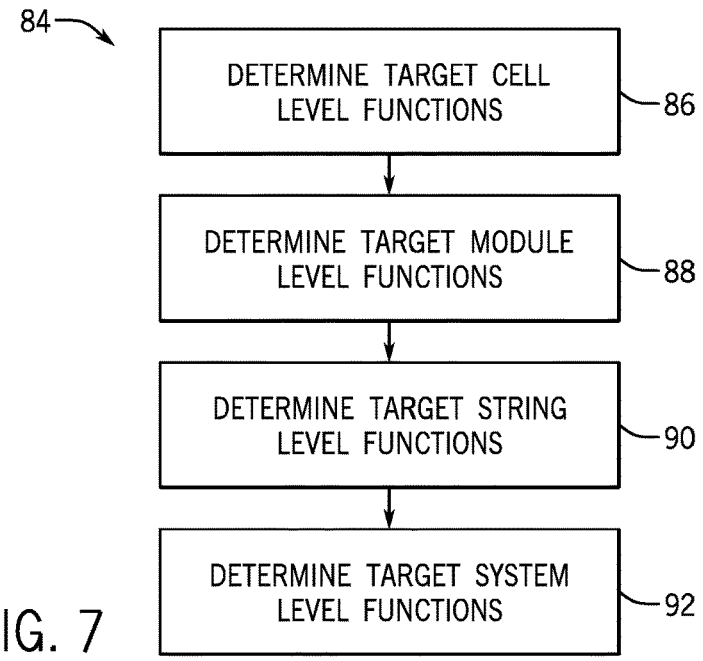
FIG. 7 is a flow diagram of a process for determining target functions of the battery control system of FIG. 4, in accordance with an embodiment of the present disclosure.

To help illustrate, one embodiment of a process 84 for determining target functions at different control levels is described in FIG. 7. Generally, the process 84 includes determining target cell level functions (process block 86), determining target module level function (process block 88), determining string level functions (process block 90), and determining system level functions (process block 92). In some embodiments, the process 84 may be implemented by executing instructions stored in a tangible, non-transitory, computer-readable medium, such as the design memory 70, using a processor, such as the design processor 68.

Accordingly, in some embodiments, the design system 58 may determine target cell level functions (process block 86). In particular, the design system 58 may determine control functions that a battery control system 26 would potentially want to employ to control operation of battery cells 36 in a battery system 12. In some embodiments, the control functions employed by a battery control system 26 may be dependent on implementation of the battery cells 36 in the battery system 12, such as number of battery cells 36 in the battery system 12, number of battery cells 36 per battery module 24, electrical connection of battery cells 36 in the battery modules 24, target operating voltage of the battery cells 36, target operating current of the battery cells 36, power rating of the battery cells 36, storage capacity of the battery cells 36, and/or target operating temperature of the battery cells 36.

Thus, based at least in part on the battery cell implementation, the design system 58 may determine the target cell level functions. In some embodiments, the design system 58 may determine that the target cell level functions include determining operational parameters (e.g., voltage) of a battery cell 36, for example, to detect faults in the battery cell 36. The design system 58 may also determine that the target cell level functions include providing control commands, for example, to disconnect a battery cell 36 when a fault is detected in the battery cell 36, to control supply of electrical power to (e.g., charging) the battery cell 36, and/or to control supply of electrical power (e.g., discharging) from the battery cell 36.

Additionally, the design system 58 may determine target module level functions (process block 88). In particular, the design system 58 may determine control functions that a battery control system 26 would potentially want to employ to control operation of battery modules 24 in a battery system 12. In some embodiments, the control functions employed by a battery control system 26 may be dependent on implementation of the battery modules 24 in the battery system 12, such as number of battery modules 24 in the battery system 12, number of battery modules 24 per battery string 52, number of battery modules 24 per battery chain 44, target operating voltage of the battery modules 24, power rating of the battery modules 24, storage capacity of the battery modules 24, and/or target operating temperature of the battery modules 24.

Thus, based at least in part on the battery module implementation, the design system 58 may determine the target module level functions. In some embodiments, the design system 58 may determine that the target module level functions include determining operational parameters (e.g., voltage) of a battery module 24, for example, to detect faults in the battery module 24. Additionally, the design system 58 may determine that the target module level functions include coordinating operation of multiple battery cells 36 in the battery modules 24, for example, such that the multiple battery cells 36 operate at approximately the same voltage and/or approximately the same current. Furthermore, the design system 58 may determine that the target module level functions include providing control commands, for example, to disconnect a battery module 24 when a fault is detected in the battery module 24, to control supply of electrical power to (e.g., charging) the battery module 24, and/or to control supply of electrical power (e.g., discharging) from the battery module 24.

Furthermore, the design system 58 may determine target string level functions (process block 90). In particular, the design system 58 may determine control functions that a battery control system 26 would potentially want to employ to control operation of battery strings 52 in a battery system 12. In some embodiments, the control functions employed by a battery control system 26 may be dependent on implementation of the battery strings 52 in the battery system 12, such as number of battery strings 52 in the battery system 12, number of battery strings 52 per battery chain 44, target operating voltage of the battery strings 52, and/or target operating current of the battery strings 52.

Thus, based at least in part on the battery string implementation, the design system 58 may determine the target string level functions. In some embodiments, the design system 58 may determine that the target string level functions include determining operational parameters (e.g., voltage) of a battery string 52, for example, to detect faults in the battery string 52. Additionally, the design system 58 may determine that the target string level functions include coordinating operation of battery modules 24 in the battery string 52, for example, such that the multiple battery modules 24 operate at approximately the same voltage and/or approximately the same current. Furthermore, the design system 58 may determine that the target string level functions include providing control commands, for example, to disconnect a battery string 52 when a fault is detected in the battery string 52, to control supply of electrical power to (e.g., charging) the battery string 52, and/or to control supply of electrical power (e.g., discharging) from the battery string 52.

The design system 58 may also determine target system level functions (process block 92). In particular, the design system 58 may determine control functions that a battery control system 26 would potentially want to employ to control operation of a battery system 12. In some embodiments, the control functions employed by a battery control system 26 may be dependent on implementation of the battery system 12, such as target operating voltage of the battery system 12 and/or target operating current of the battery system 12.

Thus, based at least in part on the battery system implementation, the design system 58 may determine the target system level functions. In some embodiments, the design system 58 may determine that the target system level functions include determining operational parameters (e.g., voltage) of a battery system 12, for example, to detect faults in the battery system 12. Additionally, the design system 58 may determine that the target system level functions include coordinating operation of multiple battery strings 52 in the battery system, for example, such that the multiple battery strings 52 operate at approximately the same voltage and/or approximately the same current. Furthermore, the design system 58 may determine that the target string level functions include providing control commands, for example, to disconnect a battery system 12 when a fault is detected in the battery system 12, to control supply of electrical power to (e.g., charging) the battery system 12, and/or to control supply of electrical power (e.g., discharging) from the battery system 12.

In this manner, the design system 58 may determine target functions of a battery control system 26. As described above, in some embodiments, the target functions may be determined at multiple different control level, for example, to determine target cell level functions, target module level functions, target string level functions, and/or target system level functions. As should be appreciated, the target functions may be determined for any number of control levels. For example, in some embodiments, the target functions may include target chain level functions. Moreover, in some embodiments, the target functions may be determined at a single control level—particularly in less complex battery system 12, for example, with fewer number of battery modules 24.

Returning to the process 74 of FIG. 6, the design system 58 may determine infrastructure expected to be used in a battery system 12 to implement each of the target functions (process block 80). In some embodiments, to facilitate implementing a target function, a battery control system 26 may communicate data, process data, and/or utilize electrical power. Thus, in some embodiments, the design system 58 may determine communication infrastructure, processing infrastructure, and/or power infrastructure expected to be utilized to implement the target functions.

Figure 8:
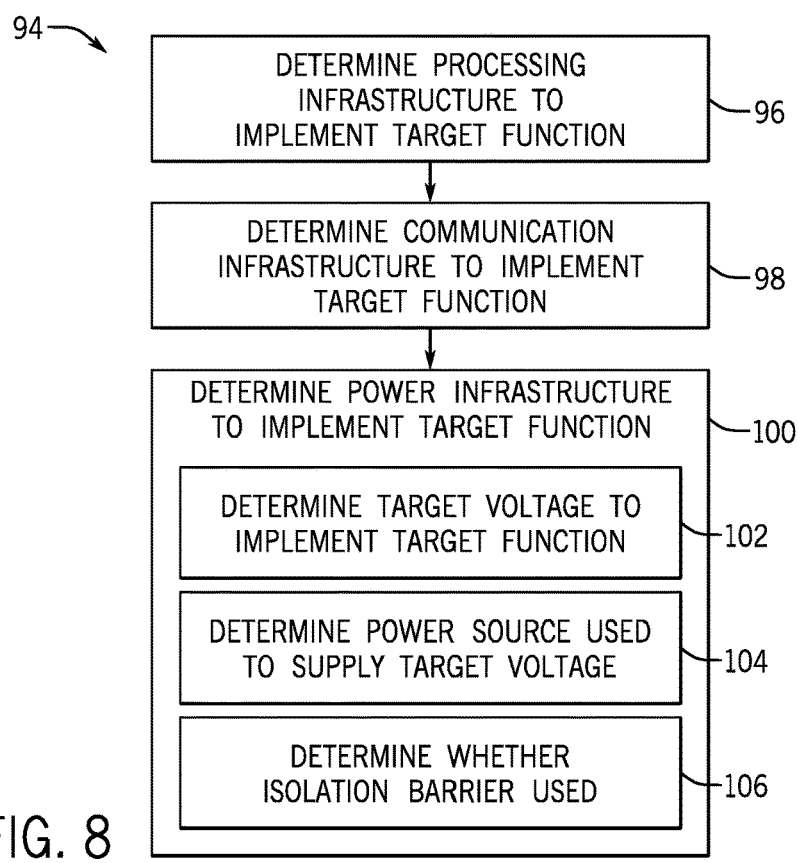
FIG. 8 is a flow diagram of a process for determining infrastructure in the battery control system of FIG. 4 used to implement the target functions, in accordance with an embodiment of the present disclosure.

To help illustrate, one embodiment of a process 94 for determining infrastructure expected to be utilized to implement target functions is described in FIG. 8. Generally, the process 94 includes determining processing infrastructure to implement a target function (process block 96), determining communication infrastructure to implement the target function (process block 98), and determining power infrastructure to implement the target function (process block 100). In some embodiments, the process 94 may be implemented by executing instructions stored in a tangible, non-transitory, computer-readable medium, such as the design memory 70, using a processor, such as the design processor 68.

Accordingly, in some embodiments, the design system 58 may determine processing infrastructure expected to be used to implement a target function (process block 96). In some embodiments, the battery control system 26 may utilize different types of processing infrastructure, such as analog-to-digital converters (ADCs), logic circuitry, processor units, and/or processing circuitry, to process and/or analyze data used for controlling operation. Thus, in some embodiments, the design system 58 may determine number and/or type of processing infrastructure expected to be used to implement the target function.

Additionally, the design system 58 may determine communication infrastructure expected to be used to implement the target function (process block 98). In some embodiments, the battery control system 26 may utilize different types of communication infrastructure, such as serial communication interfaces, parallel communication interfaces, serial communication busses and/or parallel communication busses, to communicate data externally and/or internally between different components. Thus, in some embodiments, the design system 58 may determine number and/or type of communication infrastructure expected to be used to implement the target function.

Furthermore, the design system 58 may determine power infrastructure expected to be used to implement the target function (process block 100). In some embodiments, the battery control system 26 may consume electrical power to facilitate processing and/or communicating data. Thus, in some embodiments, the design system 58 may determine target operating voltage (e.g., voltage domain) of components in the battery control system 26 (process block 102) and power source expected to be used to supply electrical power at the target operating voltage (process block 106).

As described above, in some embodiments, different portions of the battery control system 26 may operate in different voltage domains and, thus, may include an isolation barrier 56 therebetween. Accordingly, in some embodiments, the design system 58 may determine whether portions of the battery control system 26 used to implement the target function operate in different voltage domains and determine whether an isolation barrier 56 is expected to be used to implement the target function based at least in part on whether portion of the battery control system 26 expected to be used to implement the target function operate in different voltage domains.

In this manner, the design system 58 may determine infrastructure of a battery control system 26 expected to be used to implement one or more target functions. As described above, in some embodiments, a target function may be implemented using processing infrastructure, communication infrastructure, and/or power infrastructure. As should be appreciated, in other embodiments, other types of infrastructure may additionally or alternatively be used to implement a target function and, thus, determined by the design system. For example, in some embodiments, the infrastructure to implement a target function may include other physical infrastructure, such as spacing infrastructure, packaging infrastructure, and/or switching (e.g., relay, contactor, and/or circuit breaker) infrastructure.

Returning to the process 74 of FIG. 6, the design system 58 may determine a hybrid battery control system architecture by assigning target functions and associated infrastructure to building blocks (process block 82). In particular, the design system 58 may determine which of the target functions to assign to building blocks. As described above, a target function may be implemented used infrastructure in the building blocks, thereby affecting implementation associated cost, such as building block size, packing of a building block (e.g., within a battery module), component count, operational power consumption, and/or component cost. Additionally, providing a target function may increase number of different battery control system 26 capable of being implemented, thereby affecting implementation flexibility.

Thus, to determine which target functions to provide, the design system 58 may evaluate effect providing each target function is expected to have of implementation flexibility and/or implementation associated cost. In some embodiments, to facilitate balancing the expected effects, the design system 58 may utilize the objective function 72. For example, based on the objective function 72, the design system 58 may exclude a target function expected to be utilized in fewer battery control systems 26 since the increase in implementation associated cost—particular in battery control systems 26 that do not utilize the target function—may outweigh the improved implementation flexibility resulting from providing the target function. On the other hand, based on the objective function 72, the design system may assign a target function expected to be utilized in more battery control system 26 since the improved implementation flexibility may outweigh the increase in implementation associated cost resulting from providing the target function.

In some instances, multiple target functions may at least partially overlap. For example, a function to determine current flowing through a battery string 52 may also indicate the current flowing through a battery modules 24 in the battery string 52. Additionally, a function to instruct a relay to disconnect a battery string 52 may also disconnect a battery module in the battery string 52. Furthermore, a function to determine voltage across a battery module 24 may at least provide an indication of voltage across the battery cells 36 in the battery module 24.

Thus, in some embodiments, the design system 58 may determine target functions to be assigned that at least partially overlap. In this manner, to facilitate reducing implementation associated cost, the design system 58 may determine the hybrid battery control system architecture such that some target functions along with associated infrastructure are centralized to fewer (e.g., one) building blocks. In particular, centralizing some target functions may facilitate reducing amount of redundant infrastructure used to implement a battery control system 26, thereby reducing implementation associated cost.

Additionally, the design system 58 may determine the hybrid battery control system architecture such that some target functions along with associated infrastructure are distributed to multiple building blocks. In some instances, target functions provided by each building block may affect implementation flexibility. For example, when a string control unit 50 and a cell control unit 46 are both capable of providing a target function, a battery system 26 may implement the target function using a string control unit 50, a cell control unit 46, or both a string control unit 50 and a cell control unit 46. Thus, distributing some target functions may facilitate increasing number of compatible battery control system 26 (e.g., with varying target control levels), thereby improving implementation flexibility.

Accordingly, to facilitate determining whether to centralize or distribute target functions, the design system 58 may determine the effect centralizing and the effect distributing the target is expected to have on implementation flexibility and/or implementation associated cost. In some embodiments, to facilitate balancing the expected effects, the design system 58 may utilize the objective function 72. For example, based on the objective function 72, the design system 58 centralize computationally intensive functions in string control units 50, thereby facilitating reduced processing infrastructure in cell control units 46, reduced processing infrastructure in system control units 48, and/or reduced communication infrastructure implemented in a battery control system 26. Additionally, based on the objective function 72, the design system 58 may centralize communication functions used to facilitate communication between electrical components operating in different voltage domains in string control units 50, thereby facilitating reduced number of isolation barriers 56 cell control units 46 and/or system control units 48.

Furthermore, based on the objective function 72, the design system 58 may centralize communication functions used to facilitate communication with external components in a system control unit 48, thereby facilitate reduced communication infrastructure in the cell control units 46 and/or string control units 50. Moreover, based on the objective function 72, the design system 58 may centralize functions used to determine some operational parameters. For example, centralizing a current determination function in string control units 50 may obviate communication infrastructure, which may otherwise be used to communicate the current flow from a cell control unit 46 to a string control unit 50.

On the other hand, based on the objective function 72, the design system 58 may distribute less computationally complex functions to different control levels to facilitate improving control granularity. For example, the design system 58 may distribute voltage determination functions to cell control units 46 and string control units 50, thereby enabling a battery control system 26 to determine at any combination of multiple different control levels. In this manner, the design system 58 may determine the hybrid battery control system architecture to enable implementing battery control system 26 with different control levels. For example, the hybrid battery control system architecture may enable implementing a battery control system 26 with only a system control level as well as a battery control system 26 with a module control level, a string control level, and a system control level.

Moreover, in some embodiments, providing multiple control levels may facilitate improving operation of the battery control system 26. In some embodiments, this may facilitate improving diagnostics, for example, by enabling the battery control system 26 to better locate the cause of fault. For example, when a fault is detected in a battery string 52, by determining operational parameters at the module control level, the battery control system 26 may identify a specific battery module 24 as the cause of the fault, thereby enabling the specific battery module 24 to be replaced instead of the entire battery string 52.

In this manner, utilizing the techniques described above, the design system 58 may determine a hybrid battery control system architecture that improves implementation flexibility and/or reduces implementation associated cost of battery control systems 26. In some embodiments, implementation flexibility and implementation associated cost may be inversely related. Thus, by utilizing the objective function 72, the design system 58 may strike a target balance between expected effect on implementation flexibility and expected effect on implementation associated cost. In fact, in some embodiments, the design system 58 may adjust the objective function 72 to facilitate determining a hybrid battery control system architecture that strikes a different target balance between implementation associated cost and implementation flexibility. In other words, the design system 58 may be capable of determining multiple different hybrid battery control system architectures that result in different balances between implementation flexibility and implementation associated cost. To help illustrate, some example hybrid battery control system architectures are described below.

Example Hybrid Battery Control System Architecture

Figure 9:
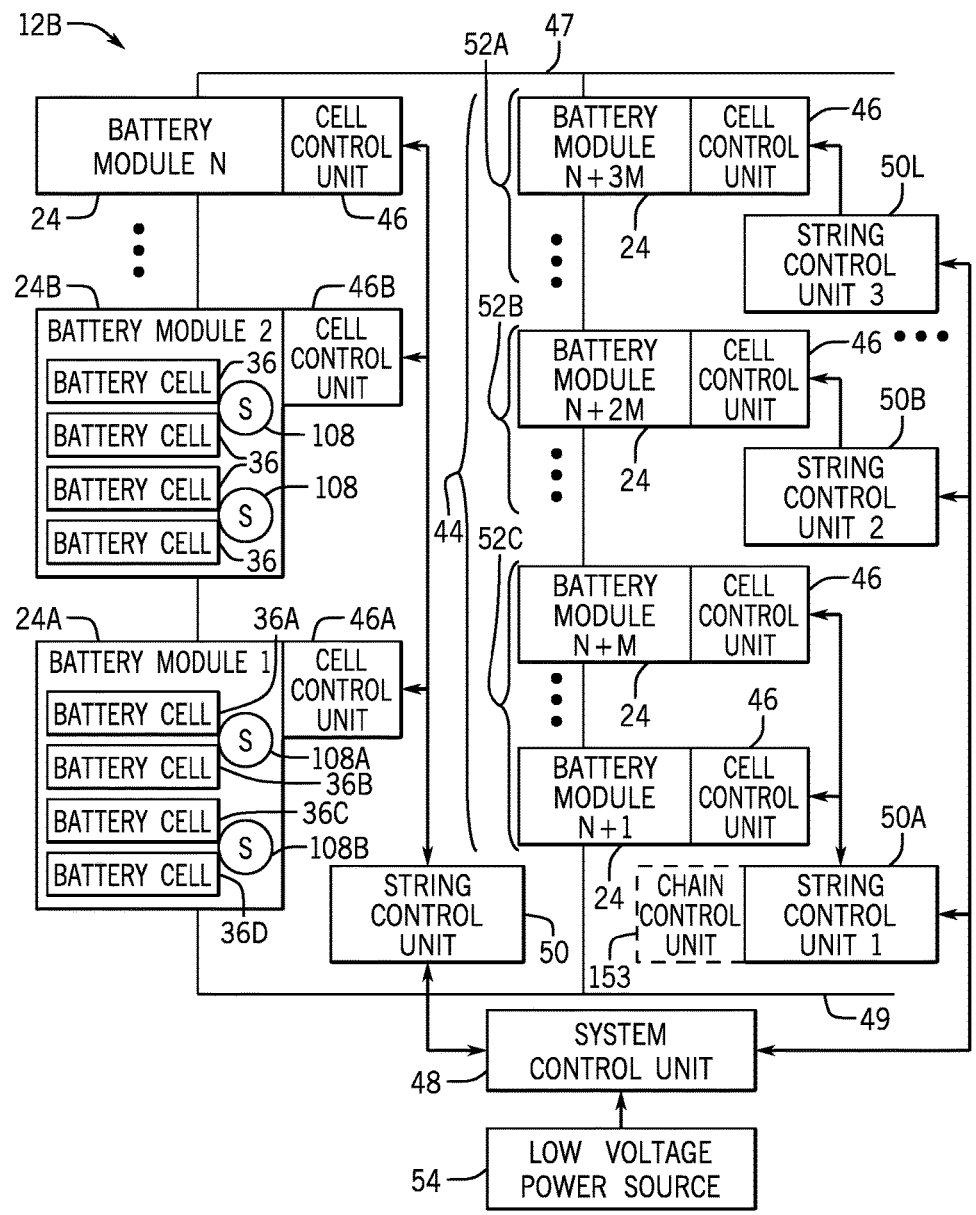
FIG. 9 is a block diagram of the battery system of FIG. 4 with the battery control system implemented using cell control units, string control units, and a system control unit based on an example architecture, in accordance with an embodiment of the present disclosure.

One example of a hybrid battery control system architecture used to implement the battery control system 26 in the second battery system 12B is shown in FIG. 9. As depicted, the second battery system 12B includes the low voltage power source 54 and battery modules 24 (e.g., a high voltage power source), which each includes battery cells 36. Additionally, the second battery system 12B includes battery chains 44 connected in parallel between the positive bus 47 and the negative bus 49, which each includes battery modules 24 connected in series and organized in battery strings 52.

Furthermore, the battery control system 26 is implemented using cell control units 46, string control units 50, and a system control unit 48 as provided by the hybrid battery control system architecture. As described above, the hybrid battery control system architecture may indicate system level functions to be provided by the system control unit 48. For example, the system level functions may include centralizing communication between the battery control system 26 and external components, such as a supervisory control system 18. Additionally, the system level functions may include the system level functions may include coordinating operation of battery strings 52 in the battery system 12 and/or supplying electrical power to the string control units 50.

Thus, in some embodiments, the system control unit 48 may be electrically coupled to the low voltage power source 54, thereby enabling the system control unit 48 to receive electrical power. Additionally, in some embodiments, the system control unit 48 may be electrically coupled to the string control units 50, thereby enabling the system control unit 48 to supply electrical power to the string control units 50. Furthermore, in some embodiments, the system control unit 48 may be communicatively coupled to the string control units 50, thereby enabling the system control unit 48 to communicate instructions (e.g., control commands) to the string control units 50. To enable providing the system level functions, as described above, the hybrid battery control system architecture may indicate infrastructure used in the system control unit 48.

Figure 10:
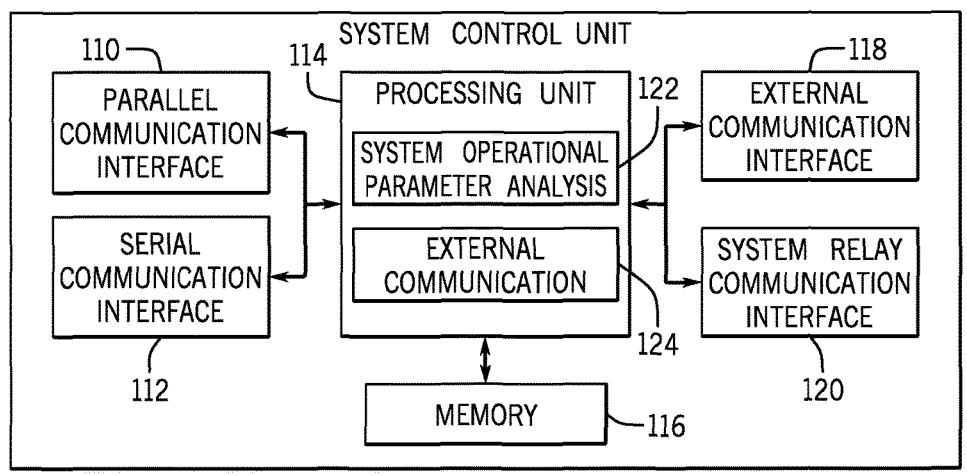
FIG. 10 is a block diagram of the system control unit of FIG. 9, in accordance with an embodiment of the present disclosure.

To help illustrate, one embodiment of a system control unit 48 (e.g., a building block) that may be specified by the hybrid battery control system architecture is shown in FIG. 10. As depicted, the system control unit 48 includes a parallel communication interface 110, a serial communication interface 112, a processing unit 114, memory 116, an external communication interface 118, and a system relay communication interface 120. It should be appreciated that the described components are merely intended to be illustrative. In other words, in actual implementation, the system control unit 48 may include additional components and/or fewer components.

With regard to the depicted embodiment, the processing infrastructure in a system control unit 48 includes the processing unit 114, which executes instructions stored in memory 116 to provide the system level functions. Thus, in some embodiments, the processing unit 114 may include one or more microprocessors and the memory 116 may include a tangible, non-transitory, computer readable medium that stores instructions executable by the processing unit 114. Thus, in such embodiments, the memory 116 may include random access memory (RAM), read only memory (ROM), rewritable non-volatile memory (e.g., flash memory), hard drives, optical discs, and the like.

As described above, the system control unit 48 may coordinate operation of the battery system 12. To facilitate coordinating operation, the processing unit 114 may process and/or analyze operational parameters related to operation of the battery system 12 (process block 122). Additionally, as described above, the system control unit 48 may centralize external communication from the battery control system 26. To facilitate providing external communication, the processing unit 114 may generate external communication data and/or process received external communication data (process block 124).

Thus, to facilitate providing the centralized external communication function, the communication infrastructure includes the external communication interface 118. In some embodiments, the external communication interface 118 may communicatively couple to an external communication network, thereby enabling the system control unit 48 to transmit and/or receive communication data with an external component via the external communication network. Additionally, to facilitate providing the battery system coordination function, the communication infrastructure includes the parallel communication interface 110 and/or the serial communication interface 112. In some embodiments, the parallel communication interface 110 may communicatively couple to a parallel communication network, such as a controller area network (CAN) and the serial communication interface 112 may communicatively couple to a serial communication network, such as a ripcord network. In this manner, the parallel communication interface 110 and/or the serial communication interface 112 may enable the system control unit 48 to transmit instructions to and/or receive operational parameters from the string control units 50.

Additionally, the communication infrastructure may include the system relay communication interface 120. In some embodiments, the system relay communication interface 120 may be communicatively coupled to a system relay, for example, which closes to connect the battery system 12 to an electrical load 16 and opens to disconnect the battery system from the electrical load 16. In this manner, the system relay communication interface 120 may enable the system control unit 48 to connect or disconnect the battery system, for example, based at least in part on analysis of received battery system operational parameters. In this manner, the hybrid battery control system architecture may provide a system control unit 48 building block along with associated infrastructure used to provide various system level functions.

Returning to the second battery system 12B shown in FIG. 9, as described above, the hybrid battery control system architecture may indicate string level functions to be provided by each of the string control units 50. For example, the string level functions may include coordinating operating of battery modules 24 in a corresponding battery string 52. Additionally, the string level functions may include centralizing communication from the corresponding battery string 52 to the system control unit 48. Furthermore, the string level functions may include providing more computationally complex functions at the string control level.

Thus, in some embodiments, a string control unit 50 may be communicatively coupled to each cell control unit 46 of the battery modules 24 in a corresponding battery string 52. For example, in the depicted embodiment, a first string control unit 50A may be communicatively coupled to the cell control units 46 corresponding to battery modules 24 in the first battery string 52A, a second string control unit 50B may be communicatively coupled to the cell control units 46 corresponding to battery modules 24 in the second battery string 52B, and a third string control unit SOL may be communicatively coupled to the cell control units 46 corresponding to battery modules 24 in the third battery string 52C. In this manner, the string control units 50 may determine string level operational parameters based at least in part on cell level operational parameters and/or module level operational parameters received from the cell control units 46.

Additionally, in some embodiments, the string control units 50 may be electrically coupled to the one or more of the cell control units 46 and/or battery modules 24, thereby enabling the string control unit 50 to receive high voltage electrical power. In this manner, a string control unit 50 may determine additional string level operational parameters, such as string current and/or string voltage.

Furthermore, as described above, the string control units 50 may receive low voltage electrical power from the system control unit 48. To facilitate reducing effect operation of the battery control system 26 has on operation of battery system 12, the string control units 50 may generally operate using the low voltage electrical power received from the system control unit 48, for example, by boosting to high voltage electrical power. However, since also receive high voltage electrical power from the battery modules 24, the string control units 50 may switch to using the high voltage electrical power, for example, when supply of the low voltage electrical power is disrupted. To enable providing the string level functions, as described above, the hybrid battery control system architecture may indicate infrastructure used in each string control unit 50.

Figure 11:
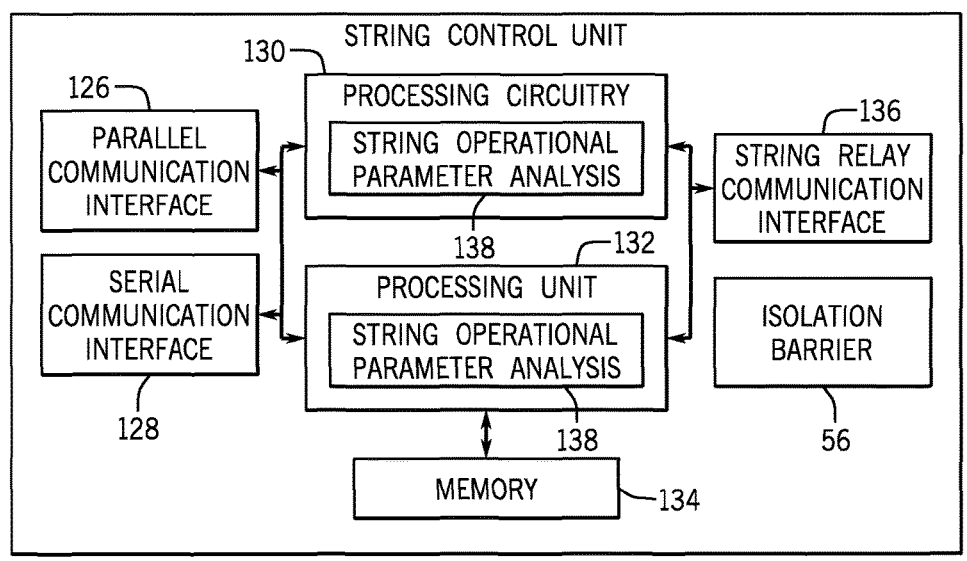
FIG. 11 is a block diagram of a string control unit of FIG. 9, in accordance with an embodiment of the present disclosure.

To help illustrate, one embodiment of a string control unit 50 that may be specified by the hybrid battery control system architecture is shown in FIG. 11. As depicted, the string control unit 50 includes a parallel communication interface 126, a serial communication interface 128, processing circuitry 130, a processing unit 132, memory 134, memory 134, a string relay communication interface 136, and an isolation barrier 56. It should be appreciated that the described components are merely intended to be illustrative. In other words, in actual implementation the string control unit 50 may include additional components and/or fewer components.

With regard to the depicted embodiment, the processing infrastructure in a string control unit 50 includes the processing circuitry 130 and the processing unit 132. In some embodiments, the processing circuitry 130 and the processing unit 132 may provide at least partially overlapping string level functions to improve reliability of the string control unit 50—particularly since more computationally complex functions may be centralized in the string control unit 50. In addition to merely using two different types of processing infrastructure, operational reliability may be improved due at least in part on different operational principles of the processing circuitry 130 and the processing unit 132. In particular, the processing circuitry 130 may operate based on programmable circuit connections formed in the processing circuitry 130 and, thus, may include one or more field programmable logic arrays (FPGAs).

On the other hand, the processing unit 132 may operate by executing instructions stored in memory 134. Thus, in some embodiments, the processing unit 132 may include one or more microprocessors and the memory 134 may include a tangible, non-transitory, computer readable medium that stores instructions executable by the processing unit 132. Thus, in such embodiments, the memory 134 may include random access memory (RAM), read only memory (ROM), rewritable non-volatile memory (e.g., flash memory), hard drives, optical discs, and the like. In this manner, likelihood of a disturbance affecting operation of both the processing circuitry 130 and the processing unit 132 simultaneously may be reduced, thereby improving operational reliability of the string control unit 50.

As described above, the string control unit 50 may coordinate operation of battery modules 24 in a corresponding battery string 52. To facilitate coordinating operation, the processing unit 132 and/or the processing circuitry 130 may process and/or analyze operational parameters related to operation of the battery modules 24 in the battery string 52 (process block 138).

Thus, to facilitate providing the battery modules 24 coordination function, the communication infrastructure includes the parallel communication interface 126 and/or the serial communication interface 128. In some embodiments, the parallel communication interface 126 may communicatively couple to a parallel communication network, such as a controller area network (CAN), and the serial communication interface 128 may communicatively couple to a serial communication network, such as a ripcord network. In this manner, the parallel communication interface 110 and/or the serial communication interface 112 may enable the string control unit 50 to receive cell level and/or module level operational parameters from the cell control units 50 and/or transmit instructions to the cell control units 50. Additionally, the parallel communication interface 110 and/or the serial communication interface 112 may enable the string control unit 50 to receive instructions (e.g., control commands) from the system control unit 48 and/or communication string level operational parameters to the system control unit 48 and/or another string control unit 50.

Moreover, to enable communication with components operating in different voltage domains, the serial communication interface 112 may include a low voltage serial communication interface that communicatively couples to a low voltage serial communication network and/or a high voltage serial communication interface that communicatively couples to a high voltage serial communication network. In this manner, in some embodiments, the low voltage serial communication interface may communicatively couple a string control unit 50 to the system control unit 48 and/or another string control unit 50 via the low voltage serial communication network. Additionally, in some embodiments, the high voltage serial communication interface may communicatively couple a string control unit 50 to one or more cell control units 48 via the high voltage serial communication network. In a similar manner, in some embodiments, the parallel communication interface 110 may include a low voltage parallel communication interface that communicatively couples to the low voltage parallel communication network and/or a high voltage parallel communication interface that communicatively couples to a high voltage parallel communication network.

Furthermore, since the string control unit 50 receives high voltage electrical power from the battery modules 24 and low voltage electrical power from the low voltage power source 54, the power infrastructure includes the isolation barrier 56. As described above, the isolation barrier 56 may facilitate electrically isolating electrical components operating in the high voltage domain and electrical components operating in the low voltage domain. In some embodiments, number of isolation barriers 56 may substantially affect implementation associated cost compared to other components, such as communication interfaces. Thus, the hybrid battery control system architecture may centralize implementation of isolation barrier 56 on a per battery string 52 basis, thereby facilitating reduced implementation associated cost. In this manner, the hybrid battery control system architecture may provide a string control unit 50 building block along with infrastructure used to provide various string level functions.

With regard to the depicted embodiment, the communication infrastructure of the string control unit 50 also includes the string relay communication interface 136. In some embodiments, the string relay communication interface 136 may be communicatively coupled to a string relay, which may be controlled to selectively connect a battery string 52 electrically to the battery system 12 and/or an electrical load. For example, the string relay communication interface 136 may enable the string control unit 50 to communicate a control command instructing the string relay to open to disconnect the battery string 52 electrically from the battery system 12. Additionally, the string communication interface 136 may enable the string control unit 50 to communicate a control command instructing the string relay to close to connect the battery string 52 electrically to the battery system 12.

As described above, in some embodiments, multiple battery strings 52 may be connected in series, for example, as a battery chain 44 with each battery string 52 utilizing a corresponding string control unit 50. In such embodiments, operating a string relay may selectively connect or disconnect multiple battery strings 52. Thus, in such embodiments, a string relay may be communicatively coupled to the string communication interface 136 of one (e.g., master) string control unit 50, thereby enabling the one string control unit 50 to communicate control commands to the string relay. In this manner, the string communication interface 136 of other (e.g., subordinate) string control units 50 may be communicatively coupled to other electrical components, such as a fan.

Returning to the second battery system 12B shown in FIG. 9, as described above, the hybrid battery control system architecture may indicate cell level functions and/or module level functions to be provided by each of the cell control units 46. Additionally, in some embodiments, a cell control unit 46 may be physically coupled to a corresponding battery module 24. For example, a first cell control unit 46A may be physically coupled to the first battery module 24A. In fact, in some embodiments, a cell control unit 46 may be disposed on or within a housing of a corresponding battery module 24. Additionally, in some embodiments, a cell control unit 46 may be electrically coupled to terminals of a corresponding battery module 24, thereby enabling the cell control unit 46 to receive electrical power used to perform the cell level functions and/or module level functions.

To facilitate coupling with and/or receiving electrical power from battery modules 24, the hybrid battery control system architecture may assign the cell control units 46 less computationally complex cell level functions and/or module level functions. As described above, in some embodiments, the cell level functions may include determining operational parameters related to operation of battery cells 36. For example, each cell control unit 46 may determine operational parameters of its corresponding battery module 24 and operational parameters of battery cells 36 in the battery module 24. In the depicted embodiment, the first cell control unit 46A may determine voltage of the first battery module 24A, voltage of a first (e.g., top) group of battery cells 36 in the first battery module 24A, voltage of a second (e.g., bottom) group of battery cells 36 in the first battery module 24A, and/or temperature of the battery module 24.

To facilitate determining the operational parameters, a cell control unit 46 may receive sensor data from one or more sensors 108 indicative of the operational parameters. Thus, in some embodiments, the sensors 108 may include one or more voltage sensors and/or one or more temperature sensors. For example, in the depicted embodiment, the first cell control unit 46A may receive sensor data from a first sensor 108A indicative of voltage of the first group of battery cells 36, which includes a first battery cell 36A and a second battery cell 36B. Additionally, the first cell control units 46A may receive sensor data from a second sensor 108B indicative of voltage of the first battery module 24A and sensor data from the second sensor 108B indicative of the second group of battery cells 36, which includes a third battery cell 36C and a fourth battery cell 36D.

Additionally, as described above, the module level functions may include centralizing communication from the corresponding battery module 24 to a string control unit 50. Furthermore, the cell level functions may include coordinating operation of battery cells 36 and/or battery cell groups in a corresponding battery module 24 based on determined operational parameters. To enable providing the cells level functions, as described above, the hybrid battery control system architecture may indicate infrastructure used in each cell control unit 46.

Figure 12:
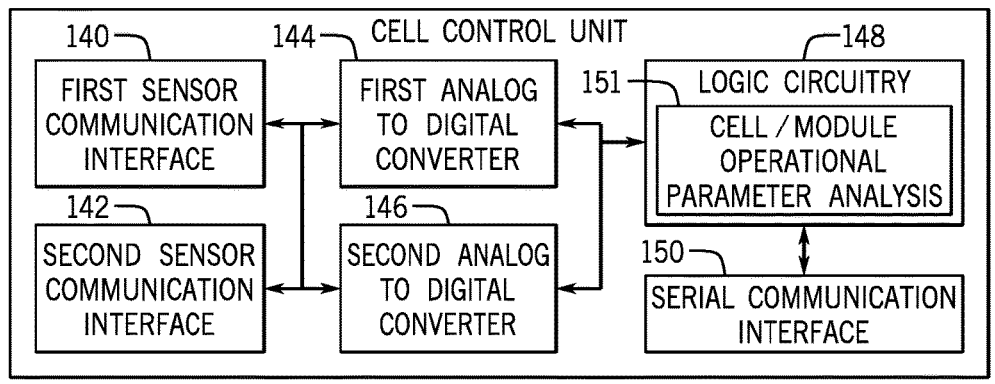
FIG. 12 is a block diagram of a cell control unit of FIG. 9, in accordance with an embodiment of the present disclosure.
Figure 13:
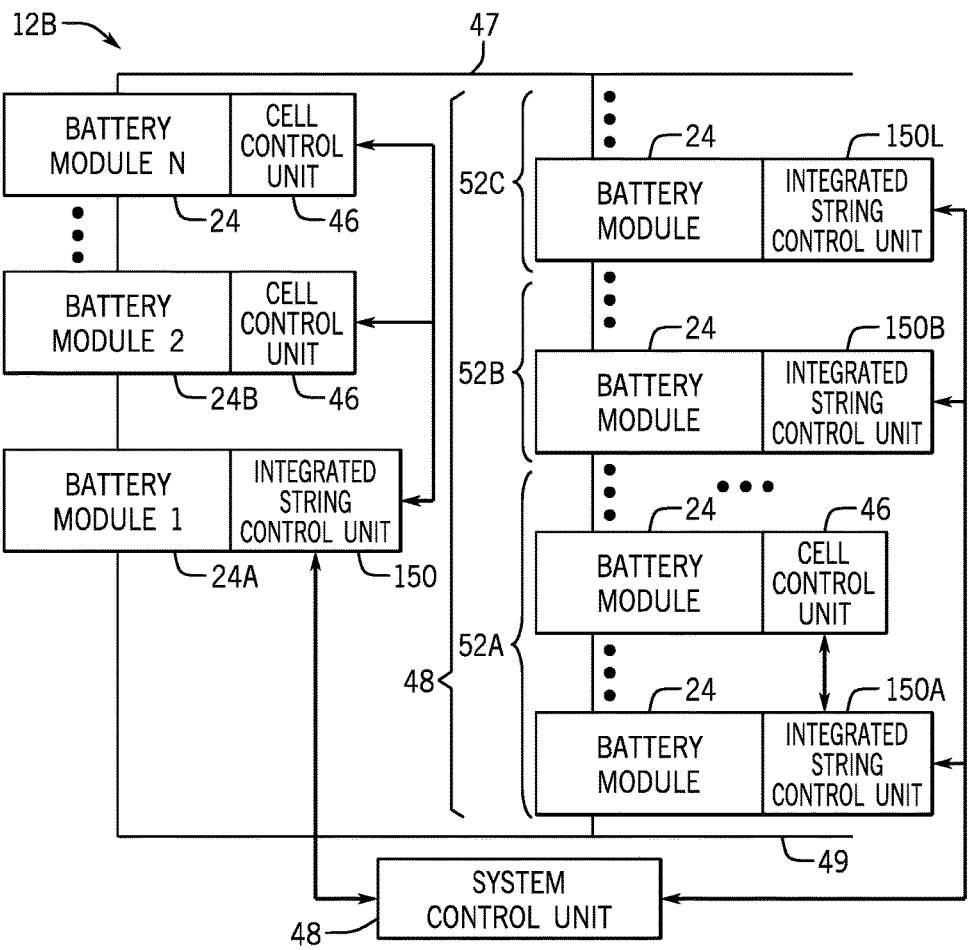
FIG. 13 is a block diagram of the battery system of FIG. 4 with the battery control system implemented using the cell control units, integrated string control units, and the system control unit based on another example architecture, in accordance with an embodiment of the present disclosure.

To help illustrate, one embodiment of a cell control unit 46 that may be specified by the hybrid battery control system architecture is shown in FIG. 12. As depicted, the cell control unit 46 includes a first sensor communication interface 140, a second sensor communication interface 142, a first analog-to-digital converter 144, a second analog-to-digital converter 146, logic circuitry 148, and a serial communication interface 150. It should be appreciated that the described components are merely intended to be illustrative. In other words, in actual implementation the cell control unit 46 may include additional components and/or fewer components.

With regard to the depicted embodiment, the processing infrastructure in the cell control unit 46 includes the first analog-to-digital converter 144, the second analog-to-digital converter 146, and the logic circuitry 148 to provide cell level functions and/or module level functions. In particular, the first analog-to-digital converter 144 and/or the second analog-to-digital converter 146 may convert data from an analog representation to a digital representation, for example, to facilitate further processing by the logic circuitry 148 and/or a string control unit 50.

As described above, a cell control unit 46 may provide less computationally complex functions to facilitate reducing implementation associated cost, reducing size, and/or reducing affect power consumption of the cell control unit 46 is expected to have on operation of a corresponding battery module 24. Thus, in some embodiments, the logic circuitry 148 may operate based on relatively fixed circuit connection formed in the logic circuitry 148, for example, to process and/or analyze operational parameters related to operation of a corresponding battery module 24 and/or battery cells 36 in the battery module 24 (process block 151).

Thus, in some embodiments, the logic circuitry 148 may include one or more one or more application-specific integrated circuits (ASICs), operational amplifiers, and/or logic gates. For example, in some embodiments, the logic circuitry 148 may perform arithmetic operations, such as addition operations, division operations, multiplication operations, and/or division operations. Additionally, in some embodiments, the logic circuitry 148 may perform logic operations, such as AND operations, OR operations, XOR operations, NOT operations, and/or NAND operations.

To facilitate providing the battery cell 36 coordination function, the communication infrastructure includes the first sensor communication interface 140 and/or the second sensor communication interface 142. In some embodiments, the first sensor communication interface 140 may communicatively couple to the first sensor 108A, thereby enabling the cell control unit 46 to receive analog representations of sensor data and the first analog-to-digital converter 144 to convert the analog representation of the sensor data to a digital representation for further processing. Additionally the second sensor communication interface 142 may communicatively couple to the second sensor 108B, thereby enabling the cell control unit 46 to receive analog representations of sensor data and the second analog-to-digital converter 146 to convert the analog representation of the sensor data to a digital representation for further processing.

Furthermore, to facilitate a string control unit 50 to provide the module level coordination function, the communication infrastructure of the cell control unit 46 include the serial communication interface 150, thereby enabling the cell control unit 46 to communicate cell level operational parameters and/or module level operational parameters to a string control unit 50, for example, via the high voltage serial communication network. In this manner, the hybrid battery control system architecture may provide a cell control unit 46 building block along with associated infrastructure used to provide various cell/module level functions.

In some embodiments, the design system 58 may facilitate implementing a battery control system 26 using the hybrid battery control system architecture. In some embodiments, the design system may analyze a battery system 12 and indicate building blocks from the hybrid battery control system architecture to be used to implement a corresponding battery control system 26. For example, returning to the second battery system 12B shown in FIG. 9, the design system 58 detect battery modules 24 and indicate a cell control unit 46 to be electrically coupled to each battery module 24. Additionally, the design system 58 may detect battery strings 52 and indicate a string control unit 50 to be communicatively and/or electrically coupled to cell control units 46 corresponding to battery modules 24 in each battery string 52. Furthermore, the design system 58 may indicate a system control unit 48 to be communicatively coupled to string control units 50 corresponding battery strings 52 in the battery system 12B.

In some embodiments, based at least in part on the indication of implementation of building blocks in a battery control system 26, the design system 58 may relatively automatically implement the battery control system 26. In other embodiments, the design system 58 may communicate the indication of the building blocks to a manufacturing system that implementations of the battery control system 26, for example, via the communication network 60 and/or output devices 64. Furthermore, in some embodiments, the design system 58 may communication the indication of the building blocks to enable a user (e.g., operator or manufacturer) to implement the battery control system 26, for example, via the communication network 60 and/or output devices 64.

Additionally, as described above, the hybrid battery control system architecture may enable expanding the battery control system 26 to provide additional control level functions. For example, to provide chain level functions, a chain control unit 153 may be communicatively coupled to a string control unit 50 used with a battery string 52 in the corresponding battery chain 44. As described above, using other hybrid battery control system architectures may provide result in varying effects on implementation flexibility and/or implementation associated cost.

Figure 14:
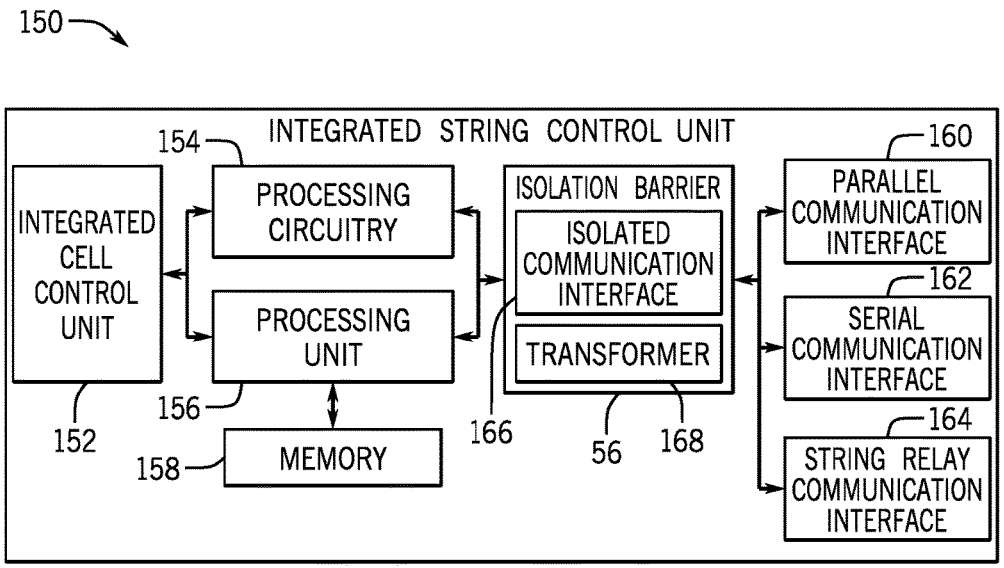
FIG. 14 is a block diagram of an integrated string control unit of FIG. 13, in accordance with an embodiment of the present disclosure.

Example Hybrid Battery Control System Architecture with Integrated String Control Unit To help illustrate, the second battery system 12B including a battery control system 26 implemented using another hybrid battery control system architecture is shown in FIG. 14. As depicted, the second battery system 12B includes battery chains 44 connected in parallel between the positive bus 47 and the negative bus 49, which each includes battery modules 24 connected in series and organized in battery strings 52. Additionally, the battery control system 26 is implemented using cell control units 46, integrated string control units 150, and a system control unit 48 as provided by the hybrid battery control system architecture. In some embodiments, the cell control units 46 and/or the system control unit 48 provided by the currently described hybrid battery control system architecture may relatively the same as in the previously described hybrid battery control system architecture.

However, the currently described hybrid battery control system architecture may specify integrated string control units 150 that vary at least partially in provided functions and/or infrastructure compared to the string control units 50 provided by the previously described hybrid battery control system architecture. In particular, since a battery string 52 generally includes at least one battery module 24, an integrated string control unit 150 may integrate cell/module level functions with string level functions. In this manner, redundant infrastructure used to implement the battery control system 26 may be reduced, thereby facilitating reduced implementation associated cost.

In some embodiments, an integrated string control unit 150 may provide string level functions for a battery string 52 and cell/battery level functions for one battery module 24 in the battery string 52. For example, in the depicted embodiment, a first integrated string control unit 150A may provide string level functions for the first battery string 52A and cell/battery level functions for one battery module 24 in the first battery string 52A. Additionally, a second integrated string control unit 150B may provide string level functions for the second battery string 52B and cell/battery level functions for one battery module 24 in the second battery string 52B. Furthermore, a third integrated string control unit 150L may provide string level functions for the third battery string 52C and cell/battery level functions for one battery module 24 in the second battery string 52B.

Thus, in some embodiments, an integrated string control unit 150 may be may be physically coupled to the corresponding battery module 24 in the battery string 52. For example, the first integrated string control unit 150A may be physically coupled to the corresponding battery module 24 in the first battery string 52A. In fact, in some embodiments, an integrated string control unit may be disposed on and/or within a housing of its corresponding battery module 24. In this manner, by providing integrated string control units 150, the hybrid battery control system architecture may facilitate reducing implementation associated cost—particularly in less complex battery system 12 (e.g., with fewer battery modules 24 and/or fewer control levels).

To help illustrate, one embodiment of an integrated string control unit 150 that may be specified by the hybrid battery control system architecture is shown in FIG. 14. As depicted, the integrated string control unit 150 includes an integrated cell control unit 152, processing circuitry 154, a processing unit 156, memory 158, an isolation barrier 56, a parallel communication interface 160, a serial communication interface 162, and a string relay communication interface 164. It should be appreciated that the described components are merely intended to be illustrative. In other words, in actual implementation the integrated string control unit 150 may include additional components and/or fewer components.

With regard to the depicted embodiment, the functions provided by the integrated cell control unit 152 may generally be the same as the functions provided by a cell control unit 46. As such, the processing infrastructure of the integrated string control unit 150 includes the processing circuitry 154, the processing unit 156, and processing infrastructure of the integrated cell control unit, such as the first analog-to-digital converter 144, the second analog-to-digital converter 146, and/or the logic circuitry 148. In some embodiments, the processing circuitry 154 and the processing unit 156 may operate to provide similar string level functions as a string control unit 50. Additionally, in some embodiments, the string level functions provided by the processing circuitry 154 and the processing unit 156 may at least partially overlap to facilitate improving operational reliability of the integrated string control unit 150.

For example, the processing circuitry 154 may operate based on programmable circuit connections formed in the processing circuitry and, thus, may include one or more field programmable logic arrays (FPGAs). Additionally, the processing unit 156 may operate by executing instructions stored in memory 158. Thus, in some embodiments, the processing unit 156 may include one or more microprocessors and the memory 158 may include a tangible, non-transitory, computer readable medium that stores instructions executable by the processing unit 156. Thus, in such embodiments, the memory 134 may include random access memory (RAM), read only memory (ROM), rewritable non-volatile memory (e.g., flash memory), hard drives, optical discs, and the like.

Additionally, when a battery string 52 including multiple battery modules 24, the integrated string control unit 150 may coordinate operation of its corresponding battery module 24 and operation of the other battery modules 24 in the battery string 52. To facilitate coordinating operation, the communication infrastructure includes the parallel communication interface 160 and/or the serial communication interface 162. In some embodiments, the parallel communication interface 160 may communicatively couple to a parallel communication network, such as a controller area network (CAN), and the serial communication interface 162 may communicatively couple to a serial communication network, such as a ripcord network. In this manner, the parallel communication interface 160 and/or the serial communication interface 162 may enable the integrated string control unit 150 to receive cell level and/or module level operational parameters from and/or transmit instructions to the cell control units 46 of other battery modules 24 in its corresponding battery string 52.

Additionally, in some embodiments, the serial communication interface 162 may enable the integrated string control unit 150 to receive string level operational parameters and/or self-configuration information from other integrated string control units 150, for example, which corresponding to other battery strings 52 in the same battery chain 44. Furthermore, in some embodiments, the parallel communication interface 160 and/or the serial communication interface 162 may enable the integrated string control unit 150 to transmit string level operational parameters to and/or receive instructions (e.g., control commands) from a system control unit 48.

With regard to the depicted embodiment, the communication infrastructure of the integrated string control unit 150 also includes the string relay communication interface 164. In some embodiments, the string relay communication interface 164 may be communicatively coupled to a string relay, which may be controlled to selectively connect a battery string 52 electrically to the battery system 12 and/or an electrical load. For example, the string relay communication interface 164 may enable the integrated string control unit 150 to communicate a control command instructing the string relay to open to disconnect the battery string 52 electrically from the battery system 12. Additionally, the string communication interface 164 may enable the integrated string control unit 150 to communicate a control command instructing the string relay to close to connect the battery string 52 electrically to the battery system 12.

As described above, in some embodiments, multiple battery strings 52 may be connected in series, for example, as a battery chain 44 with each battery string 52 utilizing a corresponding integrated string control unit 150. In such embodiments, operating a string relay may selectively connect or disconnect multiple battery strings 52. Thus, in such embodiments, a string relay may be communicatively coupled to the string communication interface 164 of one (e.g., master) integrated string control unit 150, thereby enabling the one integrated string control unit 150 to communicate control commands to the string relay. In this manner, the string communication interface 164 of other (e.g., subordinate) integrated string control units 150 may be communicatively coupled to other electrical components, such as a fan.

In some instances, including the integrated cell control unit 152 in the integrated string control unit 150 may facilitate reducing redundant infrastructure. For example, the communication infrastructure used to provide cell/module level functions may be shared with the communication infrastructure used to provide string level functions. Additionally, in some embodiments, the processing infrastructure used to provide cell/module level function may be shared with processing infrastructure used to provide string level functions. For example, the processing circuitry 154 and/or the processing unit 156 may provide processing used to implement the cell/module level functions in addition to the string level functions, which may obviate use of separate logic circuitry in the integrated string cell control unit 152. In this manner, by providing the integrated string control unit 150, the hybrid battery control system architecture facilitate reducing implementation associated cost of battery control systems 26.

Moreover, by specifying the integrated string control unit 150, the hybrid battery control system architecture may enable implementing a battery control system 26 with fewer components (e.g., building blocks). For example, the hybrid battery control system architecture may enable implementing a battery control system 26 for a battery system 12 including one battery module 24 using a single integrated string control unit 150, thereby obviating use of cell control units 46 and/or a system control unit 48. In this manner, the hybrid battery control system architecture may also facilitate improving implementation flexibility.

To facilitate determining string level operational parameters, the integrated string control unit 150 may receive high voltage electrical power from the battery modules 24 and low voltage electrical power, for example, directly from the low voltage power source 54 and/or via a system control unit 48. Thus, the power infrastructure of the integrated string control unit 150 includes the isolation barrier 56, which electrically isolates electrical components operating in the high voltage domain and electrical components operating in the low voltage domain.

Although electrically isolated, the integrated string control unit 150 may still be communicatively coupled to a system control unit 48 and/or other electrical components, such as a supervisory control system 18. Thus, to facilitate communication, the isolation barrier 56 may include an isolated communication interface 166. In some embodiments, the isolated communication interface 166 may include one or more digital communication busses, optocouplers, photocouplers, and/or optical isolators. In this manner, the processing circuitry 154 and/or the processing unit 156 may be communicatively coupled to the communication infrastructure of the integrated string control unit 150 via the isolated communication interface 166.

Moreover, in some embodiments, the processing circuitry 154 and/or processing unit 156 may operate in a high voltage domain. However, to facilitate reducing affect power consumption of battery control system 26 has on operation of the battery system 12, the processing circuitry 154 and/or the processing unit 156 may receive electrical power supplied by the low voltage power source 54. To facilitate using electrical power supplied from the low voltage power source 54, the isolation barrier 56 may include a transformer 168. In operation, the transformer 168 may receive low voltage electrical power and generate high voltage electrical power, which may then be supplied to the processing circuitry 154 and/or the processing unit 156, while maintaining electrical isolation. When supply of electrical power from the low voltage power source 54 is disrupted, the integrated string control unit 150 may switch to supplying electrical power to the processing circuitry 154 and/or the processing unit 156 from the battery modules 24.

Moreover, to enable communication with components operating in different voltage domains, the serial communication interface 162 may include a low voltage serial communication interface that communicatively couples to a low voltage serial communication network and/or a high voltage serial communication interface that communicatively couples to a high voltage serial communication network. In this manner, in some embodiments, the low voltage serial communication interface may communicatively couple an integrated string control unit 150 to the system control unit 48 and/or another integrate string control unit 150 via the low voltage serial communication network. Additionally, in some embodiments, the high voltage serial communication interface may communicatively couple an integrated string control unit 150 to one or more cell control units 48 via the high voltage serial communication network. In a similar manner, in some embodiments, the parallel communication interface 160 may include a low voltage parallel communication interface that communicatively couples to the low voltage parallel communication network and/or a high voltage parallel communication interface that communicatively couples to a high voltage parallel communication network. In this manner, the hybrid battery control system architecture may provide an integrated string control unit 150 along with associated infrastructure used to provide various cell level functions, module level functions, and string level functions.

Figure 15:
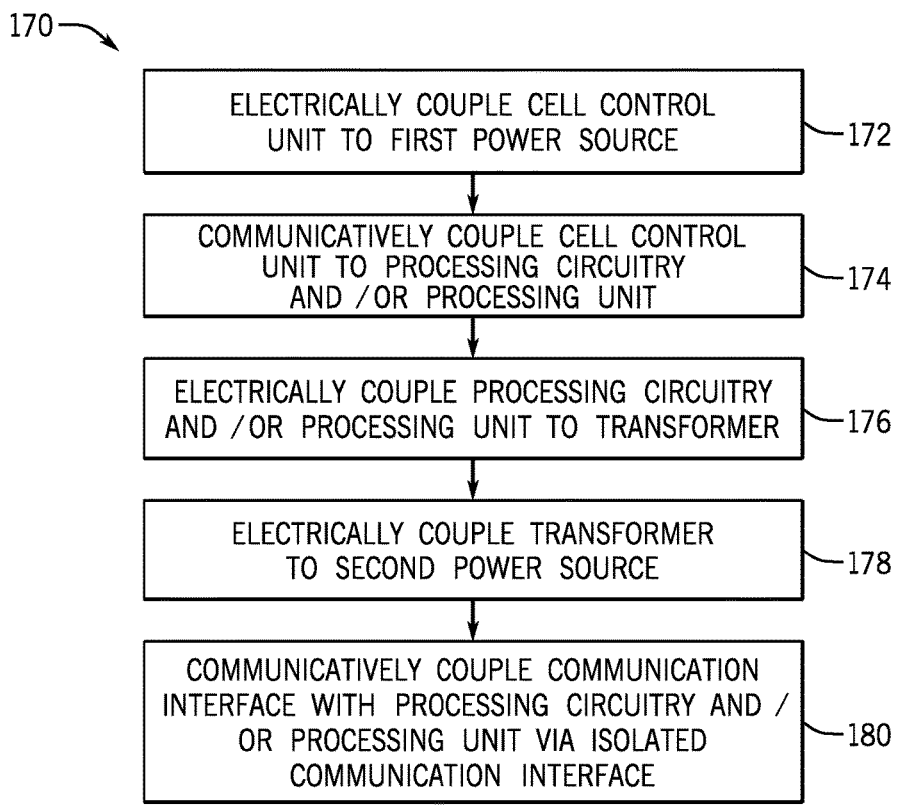
FIG. 15 is a flow diagram of a process for implementing the integrated string control unit of FIG. 14, in accordance with an embodiment of the present disclosure.

One embodiment of a process 170 for implementing an integrated string control unit 150 is described in FIG. 15. Generally, the process 170 includes electrically coupling a cell control unit to a first power source (process block 172), communicatively coupling the cell control unit to processing circuitry and/or a processing unit (process block 174), electrically coupling the processing circuitry and/or the processing unit to a transformer (process block 176), electrically coupling the transformer to a second power source (process block 178), and communicatively the processing circuitry and/or the processing unit to a communication interface via an isolated communication interface (process block 180). In some embodiments, the process 170 may be implemented by executing instructions stored in a tangible, non-transitory, computer-readable medium, such as the design memory 70, using a processor, such as the design processor 68, for example, by a manufacturer and/or a designer of the integrated string control unit 150.

Accordingly, in some embodiments, the design system 58 may indicate an integrated cell control unit 152 to be electrically coupled to a first power source (process block 172). As described above, the integrated cell control unit 152 may be electrically coupled to a corresponding battery module 24. In other words, in such embodiments, the first power source may be the battery module 24 and, thus, a high voltage power source. Additionally, in some embodiments, the integrated cell control unit 152 may be electrically coupled to the battery module 24, for example, via terminals of the battery module 24 and/or an internal bus in the battery module 24.

Additionally, the design system 58 may indicate the integrated cell control unit 152 to be communicatively coupled to processing circuitry 154 and/or a processing unit 156 (process block 174). In some embodiments, the integrated cell control unit 152 may be communicatively coupled to the processing circuitry 154 and/or the processing unit 156 via one or more internal communication busses. In this manner, communication infrastructure (e.g., communication interfaces) used to communicatively couple the integrated cell control unit 152 to a communication (e.g., CAN or ripcord) network may be obviated.

Furthermore, the design system 58 may indicate the processing circuitry 154 and/or the processing unit 156 to be electrically coupled to the transformer 168 (process block 176) and the transformer to be electrically coupled to a second power source (process block 178). As described above, in some embodiments, the transformer 168 may receive low voltage electrical power from the low voltage power source 54. In other words, in such embodiments, the second power source be the low voltage power source 54. Thus, in some embodiments, the transformer 168 may be electrically coupled to the low voltage power source 54 via one or more electrical busses and/or via a system control unit 48.

Additionally, as described above, the transformer 168 may generate high voltage electrical power supplied to the processing circuitry 154 and/or the processing unit 156. Thus, in some embodiments, the transformer 168 may be electrically coupled to the processing circuitry 154 and/or the processing unit 156 via one or more electrical busses. Furthermore, as described above, the transformer 168 may be connected across the isolation barrier 56 between a first (e.g., high) voltage domain and a second (e.g., low) voltage domain. Thus, in operation, the transformer 168 may facilitate supplying electrical power used to operate the processing circuitry 154 and/or the processing unit 156 in the first voltage domain using received electrical power in the second voltage domain.

The design system 58 may also indicate the processing circuitry 154 and/or the processing unit 156 to be communicatively coupled to the parallel communication interface 160 and/or the serial communication interface 162 via the isolated communication interface 166 (process block 180). In some embodiments, the processing circuitry 154 and/or the processing unit 156 may be communicatively coupled to the isolated communication interface 166 via one or more internal communication busses. Additionally, in some embodiments, the isolated communication interface 166 may be communicatively coupled to the parallel communication interface 160 and/or the serial communication interface 162 via one or more internal communication busses.

As described above, in an integrated string control unit 150, the processing circuitry 154 and the processing unit 156 may be located on an opposite side of the isolation barrier 56 from the parallel communication interface 160 and the serial communication interface 162. Thus, the isolated communication interface 166 may be connected across the isolation barrier 56 to facilitate data communication between electrical components operating in different voltage domains. In this manner, in some embodiments, the isolated communication interface 166 may facilitate data communication between the processing unit 156 and a parallel communication network via the parallel communication interface 160. Additionally, in some embodiments, the isolated communication interface 166 may facilitate data communication between the processing circuitry 154 and a serial communication network via the serial communication interface 162.

As described above, the serial communication network may communicatively couple multiple integrated string control units 150 and/or multiple string control units 50, for example, in a daisy chain. In some embodiments, the serial communication network may facilitate communicating string level operational parameters between the multiple integrated string control units 150 and/or multiple string control units 50, for example, to indicate when a fault is detected in a corresponding battery string 52. Additionally, in some embodiments, the serial communication network may facilitate self-configuring one or more of the multiple integrated string control units 150 and/or one or more string control units 50, for example, to determine order in the serial communication network.

String Control Unit Auto-Configuration and Fault Communication

Figure 16:
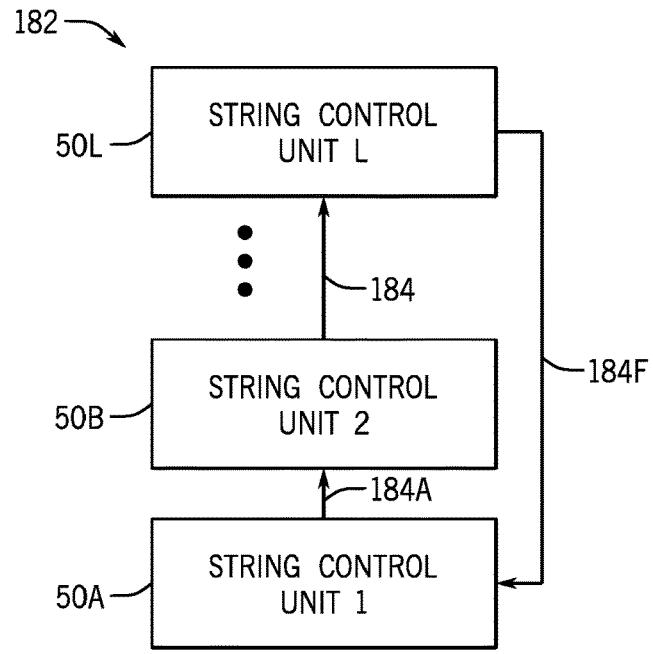
FIG. 16 is a block diagram of a master string control unit and subordinate string control units communicatively coupled via a serial communication bus daisy chain, in accordance with an embodiment of the present disclosure.

To help illustrate, one embodiment of string control units 50 connected in a serial communication network 182 is shown in FIG. 16. It should be appreciated that the following techniques are described with regard to string control units 50 merely to provide an illustrate example. In other words, the following techniques may also be applied to integrated string control units 150.

With regard to the depicted embodiment, the serial communication network 182 (e.g., ripcord network) communicatively couples multiple string control units 50—namely a first string control unit 50A, a second string control unit 50B, and a third (e.g., last) string control unit SOL. In some embodiments, the string control units 50 communicatively coupled via the serial communication network 182 may correspond to battery strings 52 included in the same battery chain 44. Thus, it should be appreciated that three string control units 50 are depicted merely to provide an illustrative example. In other embodiments, the serial communication network 182 may include two string control units 50 or more than three string control units 50.

In any case, to form the serial communication network 182, the string control units 50 are communicatively coupled via serial communication busses 184 (e.g., ripcord busses). In some embodiments, the serial communication busses 184 may be unidirectional communication busses. In such embodiments, to form the serial communication network, the string control units 50 may be connected via the serial communication busses 184 in a daisy chain configuration. For example, in the depicted embodiment, the first string control unit 50A is communicatively coupled to the second string control unit 50B via a first serial communication bus 184A and so on down the daisy chain until the last string control unit SOL. Additionally, the last string control unit SOL is communicatively coupled to the first string control unit 50A via a feedback serial communication bus 184F.

In this manner, the string control units 50 may communicate serial communication (e.g., ripcord) signals down (e.g., through) the serial communication network 182 (e.g., daisy chain) and back to the first string control unit 50A. Thus, in some embodiments, the first string control unit 50A may be considered the master string control unit. Additionally, the second string control unit 50B through last string control unit SOL may be considered subordinate string control units.

In some embodiments, communicating serial communication signal in this manner may enable a master string control unit to determine number of subordinate string control units connected to the serial communication network 182 and self-configure based at least in part on the number of subordinate string control units. Additionally, in some embodiments, communicating serial communication signals in this manner may enable a subordinate string control unit to determine its order in the serial communication network 182 and self-configure based at least in part on the determined order. Furthermore, in some embodiments, communicating serial communication signals in this manner may facilitate communicating when a fault is expected to be present to other string control units 50, for example, to enable the master string control unit to instruct a string relay to open when the fault is expected to be present.

Figure 17:
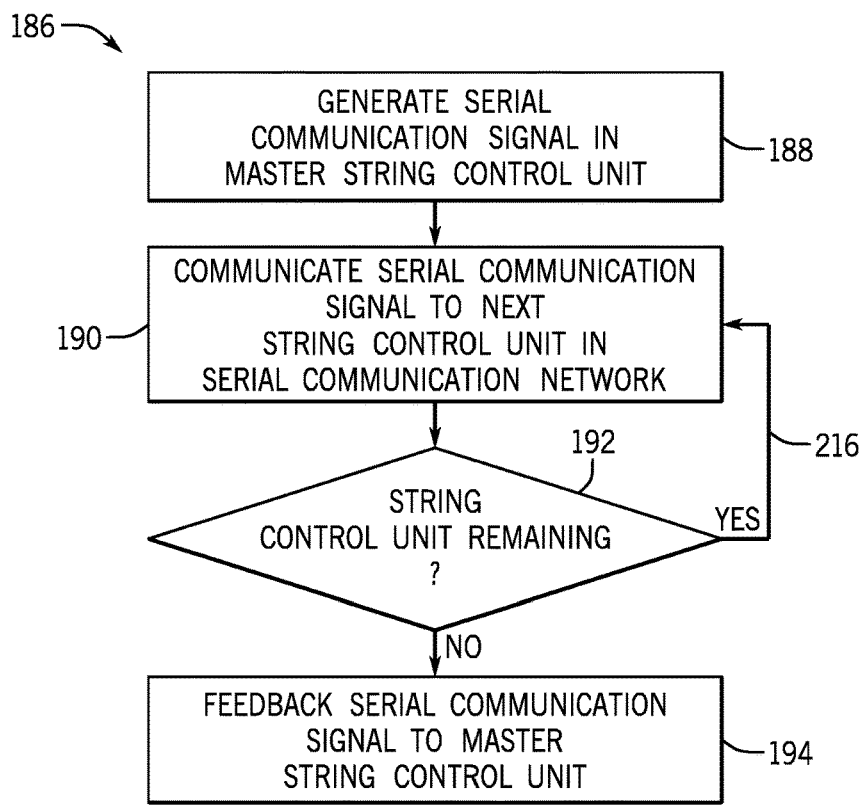
FIG. 17 is a flow diagram of a process for communicating a serial communication signal in the serial communication bus daisy chain of FIG. 16, in accordance with an embodiment of the present disclosure.

To help illustrate, one embodiment of a process 186 for operating string control units 50 connected in a serial communication network 182 (e.g., daisy chain) is described in FIG. 17. Generally, the process 186 includes generating a serial communication signal in a master string control unit (process block 188), communicating the serial communication signal to a next string control unit in a serial communication network (process block 190), determining whether subordinate string control units remain in the serial communication network (decision block 192), and feeding back the serial communication signal to the master string control unit when no subsequent string control units remain (process block 194). In some embodiments, the process 186 may be implemented by operating processing circuitry, such as processing circuitry 130 or processing circuitry 154, based on programmable circuit connections. Additionally, in some embodiments, the process 186 may be implemented by executing instructions stored in a tangible, non-transitory, computer-readable medium, such as memory 134 or memory 158, using a processor, such as the processing unit 132 or the processing unit 156.

Accordingly, in some embodiments, the first (e.g., master) string control unit 50A may generate a first serial communication signal (process block 188). In some embodiments, the serial communication signal may include a high state and a low state. Additionally, in some embodiments, the serial communication signal may be a voltage signal or a current signal.

Furthermore, in some embodiments, the serial communication signal may be frequency modulated to communicate information. For example, when a fault is not detected, the frequency of the serial communication signal generated by the first string control unit 50A may be a master frequency (e.g., 100 Hz), which indicates that the first string control unit 50A is the master string control unit in the serial communication network 182. On the other hand, when a fault is detected, the frequency of the serial communication signal generated by the first string control unit 50A may be a fault frequency (e.g., 500 Hz), which indicates that a fault has been detected.

The first string control unit 50A may then communicate the first serial communication signal to the second (e.g., next subordinate) string control unit 50B (process block 190). In some embodiments, the first string control unit 50A may communicate the first serial communication signal to the second string control unit 50B via the first serial communication bus 184A. After receiving the first serial communication signal, the second string control unit 50B may determine frequency of the first serial communication signal and operate accordingly.

Figure 18:
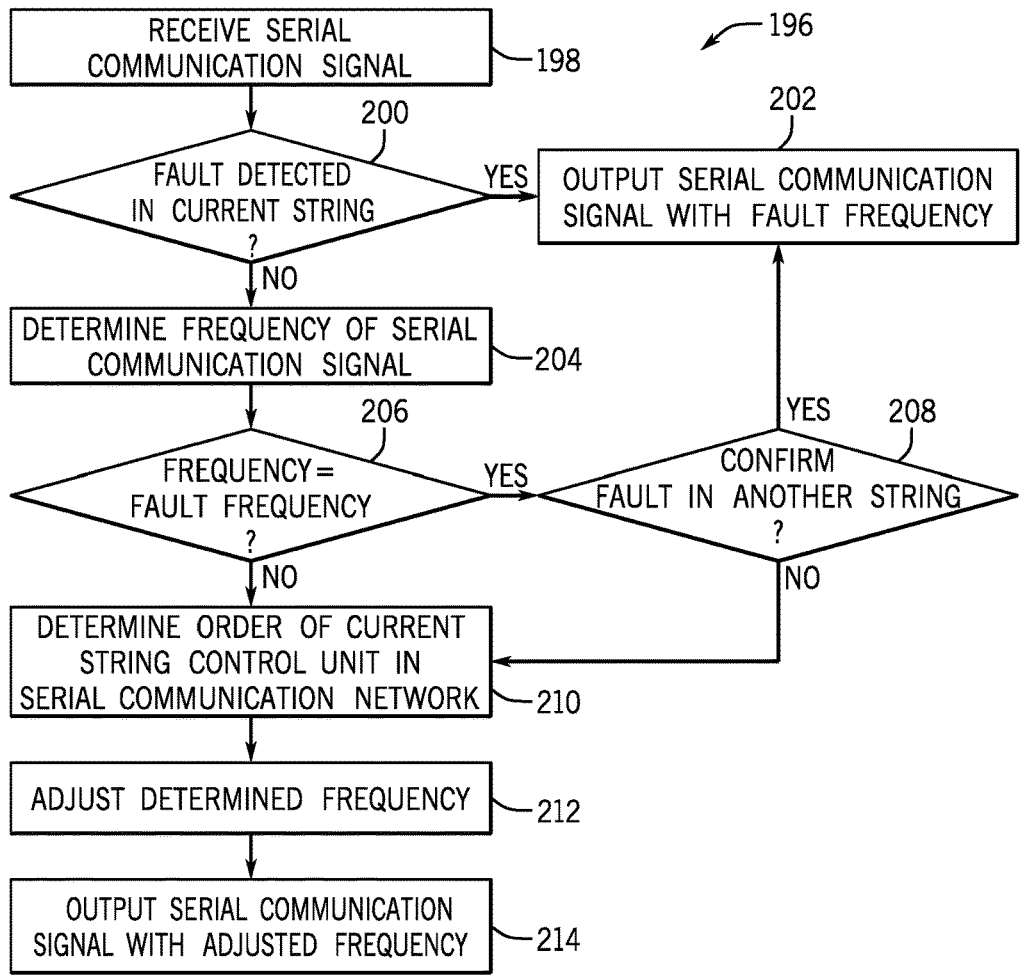
FIG. 18 is a flow diagram of a process for operating a subordinate string control unit based at least in part on the serial communication signal, in accordance with an embodiment of the present disclosure.

To help illustrate, one embodiment of a process 196 for operating a subordinate string control unit is described in FIG. 18. Generally, the process 196 includes receiving a serial communication signal at a string control unit (process block 198), determining whether a fault is detected in a current battery string (decision block 200), outputting the serial communication signal with a fault frequency when a fault is detected in the current battery string (process block 202), and determining frequency of the received serial communication signal when a fault is not detected in the current battery string (process block 204). Additionally, the process 196 includes determining whether the frequency of the received serial communication signal is equal to the fault frequency (decision block 206), determining whether a fault has been confirmed in a previous battery string when the frequency of the received serial communication signal is equal to the fault frequency (decision block 208), and determining order of the string control unit in a serial communication network when the frequency of the received serial communication signal is not equal to the fault frequency or when a fault has not been confirmed for the previous battery string (process block 210). Furthermore, the process 196 includes determining an order frequency (process block 212) and outputting a serial communication signal with the order frequency (process block 214). In some embodiments, the process 196 may be implemented by operating processing circuitry, such as processing circuitry 130 or processing circuitry 154, based on programmable circuit connections. Additionally, in some embodiments, the process 196 may be implemented by executing instructions stored in a tangible, non-transitory, computer-readable medium, such as memory 134 or memory 158, using a processor, such as the processing unit 132 or the processing unit 156.

Accordingly, in some embodiments, the second string control unit 50B may receive the first serial communication signal from the first string control unit 50A (process block 198). As described above, in some embodiments, the second string control unit 50B may receive the first serial communication signal via the first serial communication bus 184A.

Additionally, the second string control unit 50B may determine whether a fault has be detected in the second battery string 52B, the second string control unit 50B, and/or cell control units 46 communicatively coupled to the second string control unit 50B (decision block 200). In some embodiments, the second string control unit 50B may determine whether a fault is expected to be present in the second battery string 52B based at least in part on string level operational parameters. Additionally, in some embodiments, the second string control unit 50B may determine whether a fault is expected to be present in the a battery module 24 and/or a battery cell 36 in the second battery string 52B based at least in part on cell/module level operational parameters. For example, as will be described in more detail below, cell control units 46 corresponding to battery modules 24 in the second battery string 52B may indicate whether a fault is expected to be present to the second string control unit 50B.

In any case, when the second string control unit 50B determines that a fault is expected to be present, the second string control unit 50B may output a second serial communication signal with a fault frequency (process block 202). In some embodiments, the fault frequency may be commonly known by the string control units 50 as indicating that a fault has been detected. For example, in some embodiments, the fault frequency may be 500 Hz. Thus, by outputting the second serial communication signal with the fault frequency, the second string control unit 50B may indicate to the other string control units 50 communicatively coupled to the serial communication network 182 that a fault has been detected.

On the other hand, when the second string control unit 50B does not determined that a fault is expected to be present, the second string control unit 50B may determine frequency of the first serial communication signal (process block 204). In some embodiments, the second string control unit 50B may determine frequency of the first serial communication signal by determining duration between pulses. For example, the string control unit 50B may determine that the frequency is 100 Hz when the first serial communication signal alternates between the high state and the low state every 10 ms. Additionally, the second string control unit 50B may determine that the frequency is 500 Hz when the first serial communication alternates between the high state and the low state every 2 ms.

In this manner, the second string control unit 50B may determine whether the frequency of the first serial communication signal is equal to the fault frequency (decision block 206). Additionally, when the fault frequency is detected, the second string control unit 50B may confirm whether a fault has been detected in another battery string 52 (decision block 208). In other words, in some embodiments, the second string control unit 50B may not immediately determine that a fault has been detected in the battery system 12 as soon as the fault frequency has been received.

Instead, since a detected fault may result in ceasing operation (e.g., disconnecting) of at least a portion of the battery system 12, the second string control units 50B may wait a short duration before confirming that the frequency of the first serial communication signal is in fact indicating that a fault has been detected. For example, the second string control unit 50B may utilize a counter that increments when successive pulses of the first serial communication signal are at the fault frequency. In this manner, the second string control unit 50B may confirm that a fault has been detected in another battery string 52 after the counter reaches a count threshold (e.g., five). Thus, after the fault has been confirmed, the second string control unit 50B may output the second serial communication signal with the fault frequency to the other string control units 50 communicatively coupled to the serial communication network 182 (process block 202).

On the other hand, when the received frequency is not equal to the fault frequency and/or a fault has not been confirmed, the second string control unit 50B may determine order of the second string control unit 50B in the serial communication network 182 based at least in part on the frequency of the first serial communication signal (process block 210). In some embodiments, the master frequency indicating that a string control unit 50 is the master string control unit in a serial communication network may be commonly known by the string control units 50 communicatively coupled to the serial communication network 182. Accordingly, when frequency of the first serial communication signal is the master frequency, the second string control unit 50B may determine that the previous string control unit 50 is the master string control unit. In this manner, the second string control unit 50B may determine that its order is second in the serial communication network 182 and/or that it is the first subordinate string control unit 50 in the serial communication network 182.

Additionally, the second string control unit 50B may determine an order frequency that indicates its order in the serial communication network 182 (process block 212). In some embodiments, the second string control unit 50B may determine the order frequency based at least in part on the frequency of the first serial communication signal. For example, a subordinate string control unit may determine its order frequency by dividing (e.g., in half) the received frequency. To help illustrate, when the frequency of the first serial communication signal is 100 Hz, the order frequency determined by the second string control unit 50B may be 50 Hz.

The second string control unit 50B may then output the second serial communication signal with the order frequency, for example, via a serial communication bus 184 (process block 214). In this manner, a string control unit 50 that receives the second serial communication signal may determine order of the second string control unit 50B and self-configure accordingly.

In particular, returning to the process 186 of FIG. 17, the second string control unit 50B may output the second serial communication signal to a next subordinate string control unit in the serial communication network 182 when subsequent string control units remain (arrow 216). Thus, utilizing the process 196 described above, each of the subordinate string control units in the serial communication network 182 may operate to self-configure and/or indicate a detected fault. For example, when the third (e.g., last) string control unit SOL receives the second serial communication signal, the third string control unit SOL may determine frequency of the second serial communication signal. When the frequency is the fault frequency (e.g., 500 Hz), the third string control unit SOL may confirm whether a fault has been detected and self-adjust operation accordingly, for example, by outputting a third serial communication signal with the fault frequency. Additionally, when the frequency of the second serial communication signal is an order frequency (e.g., 50 Hz), the third string control unit SOL may determine that the second string control unit 50B is the first subordinate string control unit and, thus, that its order is third in the serial communication network 182 and/or that it is the second subordinate string control unit in the serial communication network 182.

On the other hand, the second string control unit 50B may feedback the second serial communication signal to the first (e.g., master) string control unit 50A when no subsequent string control units remain (process block 194). Based at least in part on the feedback serial communication signal, the first string control unit 50A may determine whether a fault has been detected in any of the other battery string 52 in a manner similar to the subordinate string control units. For example, the first string control unit 50A may determine frequency of the second serial communication signal. Additionally, when the frequency is the fault frequency (e.g., 500 Hz), the first string control unit 50A may confirm whether a fault has been detected and self-adjust operation accordingly, for example, by outputting the first serial communication signal with the fault frequency and/or instructing a string relay to open.

Additionally, based at least in part on the feedback serial communication signal, the first string control unit 50A may determine configuration of the serial communication network 182, which may include number of string control units 50 connected to the serial communication network 182 and/or number of subordinate control units connected to the serial communication network 182. In some embodiments, the first string control unit 50A may determine the configuration of the serial communication network 182 by comparing frequency of the feedback serial communication signal and the master frequency.

As described above, in some embodiments, subordinate string control units may determine order frequency by dividing received frequency by a factor (e.g., 2). Thus, when subordinate string control units determine order frequency by dividing received frequency in half, the first string control unit 50A may determine the configuration of the serial communication network 182 based at least in part on number of times the master frequency is halved to reach the frequency of the feedback serial communication signal. For example, when master frequency is 100 Hz and frequency of the feedback serial communication signal is 50 Hz, the first string control unit 50A may determine that a total of two string control units 50 are connected to the serial communication network 182 and/or that one subordinate string control unit is connected to the serial communication network 182. In a similar manner, when master frequency is 100 Hz and frequency of the feedback serial communication signal is 25 Hz, the first string control unit 50A may determine that a total of three string control units 50 are connected to the serial communication network 182 and/or that two subordinate string control unit are connected to the serial communication network 182.

In this manner, the first (e.g., master) string control unit 50A may adjust operation based at least in part on configuration of the serial communication network 182. For example, based at least in part on number of subordinate string control units connected to the serial communication network 182, the first string control unit 50A may determine number of string control units 50 to which the first string control units 50A may communicate control commands. Additionally, the configuration of the serial communication network 182 may provide the first string control unit 50A insight into implementation of a battery system 12. For example, based at least in part on total number of string control units connected to the serial communication network 182, the first string control unit 50A may determine number of battery strings 52 connected in a battery chain 44.

Figure 19:
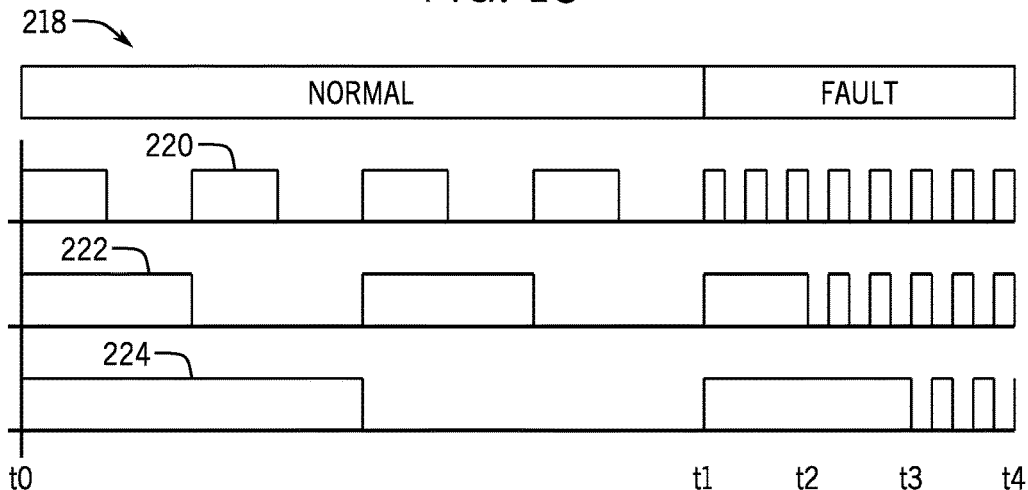
FIG. 19 is a plot of example serial communication signals output by string control units in the serial communication bus daisy chain of FIG. 16, in accordance with an embodiment of the present disclosure.

To help illustrate the techniques describe above, a plot 218 providing a visual representation of the serial communication signals output by the first string control unit 50A, the second string control unit 50B, and the third (e.g., last) string control unit SOL is shown in FIG. 19. In particular, the plot 218 includes a first waveform 220 that provides a visual representation of the first serial communication signal output by the first string control unit 50A between t0 and t4. Additionally, the plot 218 includes a second waveform 222 that provides a visual representation of the second serial communication signal output by the second string control unit 50B between t0 and t4. Furthermore, the plot 224 includes a third waveform 222 that provides a visual representation of a third serial communication signal output by the third string control unit SOL between t0 and t4.

With regarding to the depicted embodiment, a fault may not be present between t0 and t1. Thus, as depicted, the first string control unit 50A outputs the first serial communication signal with a 100 Hz frequency (e.g., master frequency). Additionally, as depicted, the second string control unit 50B outputs the second serial communication signal with a 50 Hz frequency (e.g., half of received frequency). Furthermore, as depicted the third string control unit SOL outputs the third serial communication signal with a 25 Hz frequency (e.g., half of received frequency).

However, as t1, the first string control unit 50A determines that a fault related to the first battery string 52A is expected to be present. Thus, as depicted, the first string control unit 50A starts outputting the first serial communication signal with a 500 Hz frequency (e.g., fault frequency) at t1. Additionally, as depicted, the second string control unit 50B starts outputting the second serial communication signal with a 500 Hz frequency at t2 after five (e.g., counter threshold) pulses of the first serial communication signal at 500 Hz. Furthermore, as depicted the third string control unit SOL starts outputting the third serial communication signal with a 500 Hz frequency at t3 after five pulses of the second serial communication signal at 500 Hz.

In this manner, string control units 50 communicatively coupled via a serial communication network 182 may self-configure and/or communicate detected faults. As described above, in some embodiments, the string control units 50 may detect a fault based at least in part on indication of the fault from a cell control unit 46. However, in some embodiments, processing capabilities of cell control units 46 may be limited. Nevertheless, the cell control units 46 may provide fault detection functions utilizing the processing infrastructure specified in the above-described hybrid battery control system architectures.

Cell Control Unit Fault Detection

Figure 20:
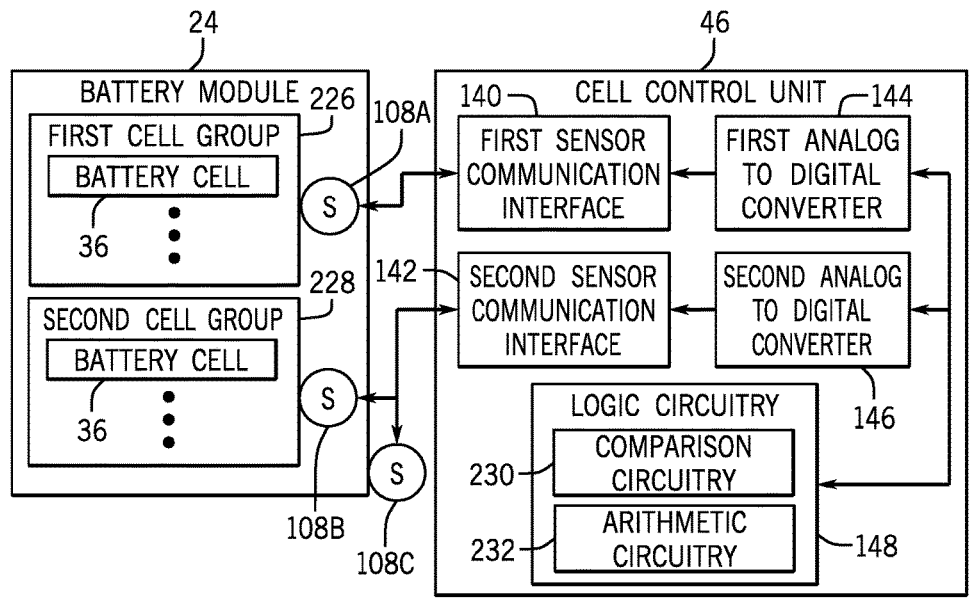
FIG. 20 is a block diagram of one battery module and one cell control unit in the battery system, in accordance with an embodiment of the present disclosure.

To help illustrate, one embodiment of a battery module 24 and a cell control unit 46 are shown in FIG. 20. As described above, a battery module 24 may include multiple battery cells 36. With regard to the depicted embodiment, the battery cells 36 in the battery module 24 are divided between a first cell group 226 and a second cell group 228. In some embodiments, the battery cells 36 may be equally divided between the first cell group 226 and the second cell group 228. For example, when the battery module 24 includes sixteen battery cells 36, the battery cells 36 may be divided such that first cell group 226 and the second cell group 228 each include eight battery cells 36.

Additionally, based on the hybrid battery control system architectures described above, the cell control unit 46 includes the first sensor communication interface 140, the second sensor communication interface 142, the first analog-to-digital converter 144, second analog-to-digital converter 146, and the logic circuitry 148. As described above, the first sensor communication interface 140 may be communicatively to the first sensor 108A, which determines operational parameters of the first cell group 226. Additionally, the second sensor communication interface 142 may be communicatively coupled to the second sensor 108B, which determines operational parameters of the second cell group 228, and a third sensor, which determines operational parameters of the battery module 24 as a whole.

For example, in some embodiments, the first sensor communication interface 140 may receive an analog representation of voltage of the first cell group 226 from the first sensor 108A. To facilitate subsequent processing, the first analog-to-digital converter 144 may generate a digital representation of the voltage of the first cell group 226. Additionally, the second sensor communication interface 142 may receive an analog representation of voltage of the second cell group 228 from the second sensor 108B and an analog representation of voltage of the battery module 24 from the third sensor 108C. To facilitate subsequent processing, the second analog-to-digital converter may generate a digital representation of the voltage of the second cell group 228 and a digital representation of the voltage of the battery module 24.

To facilitate detecting a fault using the cell control unit 46, the logic circuitry 148 may process and/or analyze the digital representations of the measured voltage generated by the first analog-to-digital converter 144 and the second analog-to-digital converter 146. In particular, the logic circuitry 148 may include comparison circuitry 230, such as an operational amplifier, to facilitate comparing voltages. Additionally, the logic circuitry 147 may arithmetic circuitry 232, such a logic adder, to facilitate adding voltages.

Figure 21:
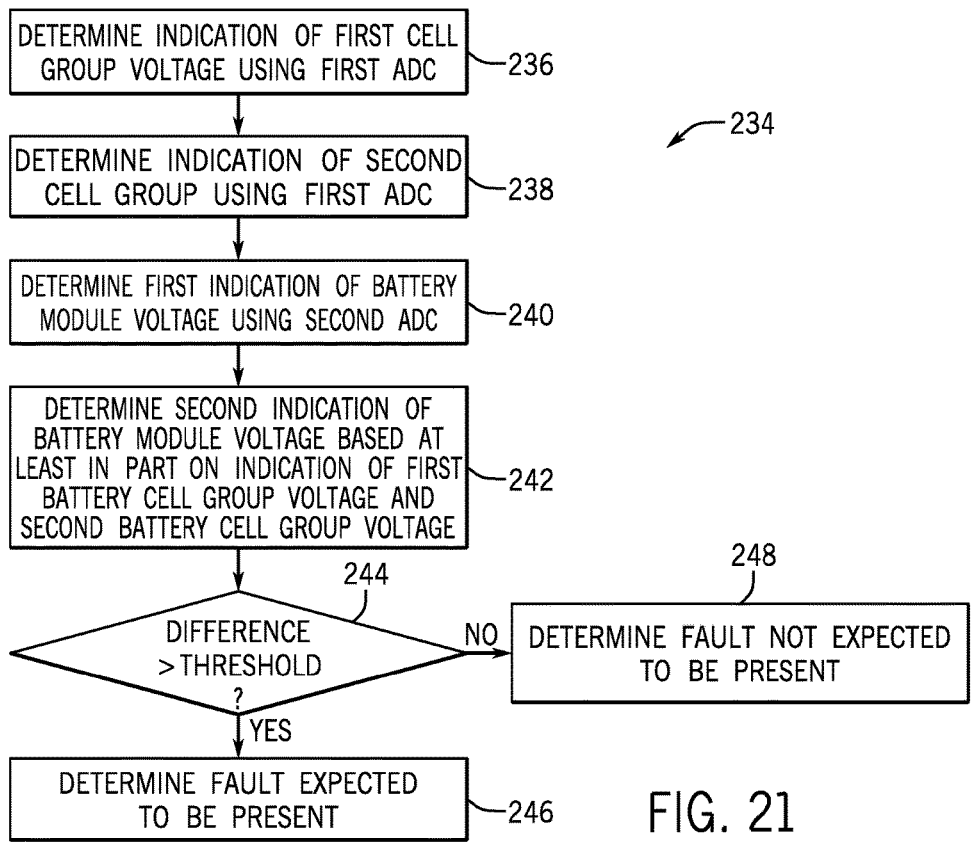
FIG. 21 is a flow diagram of a process for operating the cell control unit of FIG. 20 to detect faults, in accordance with an embodiment.
Figure 2:
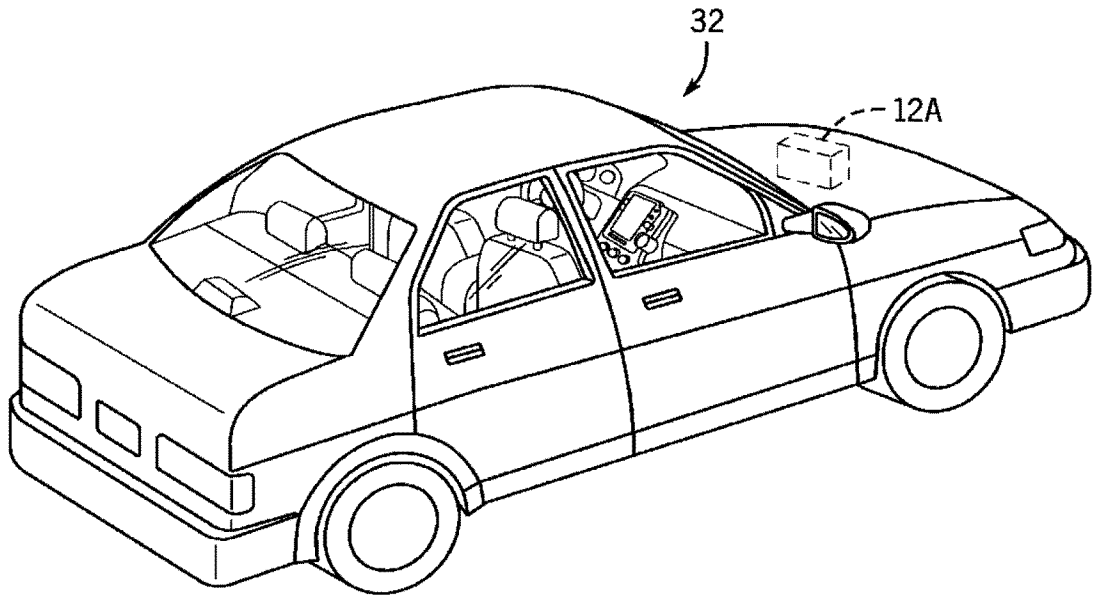
Figure 3:
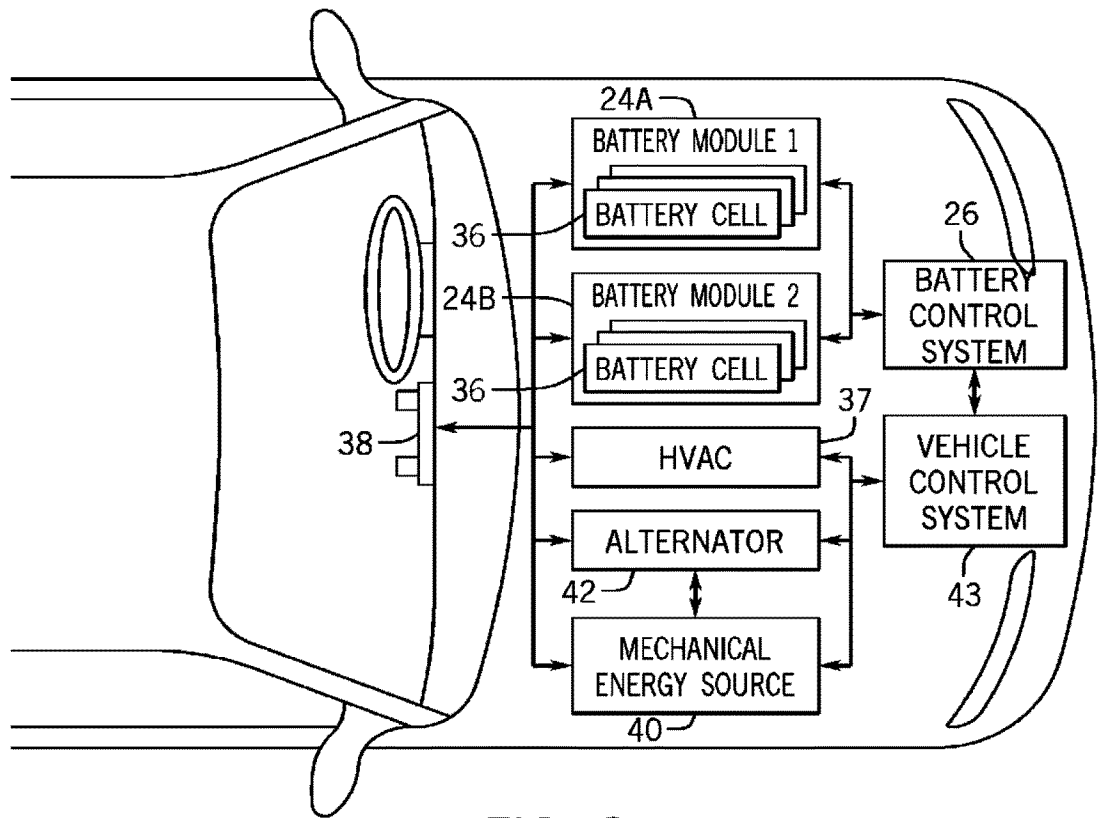
Figure 12:
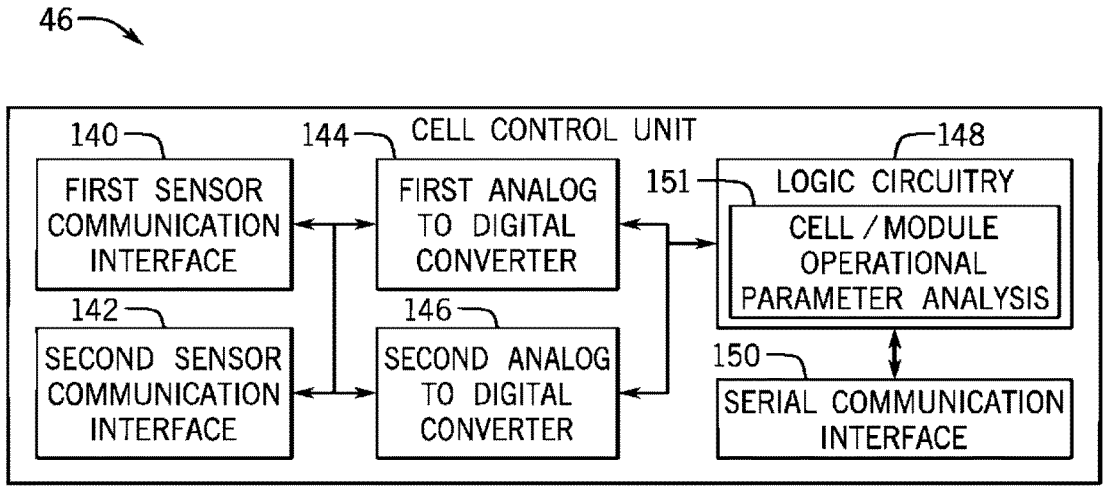
Figure 13:
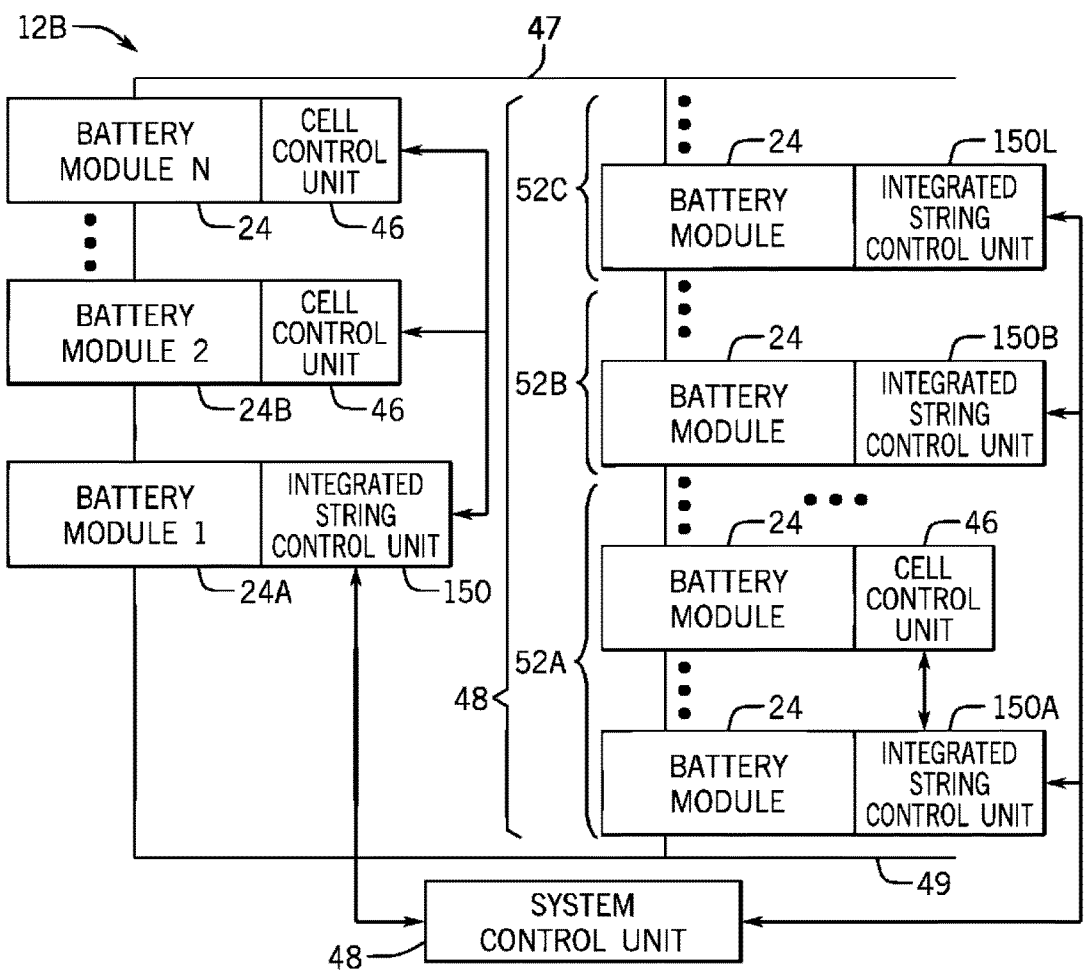
Figure 20:
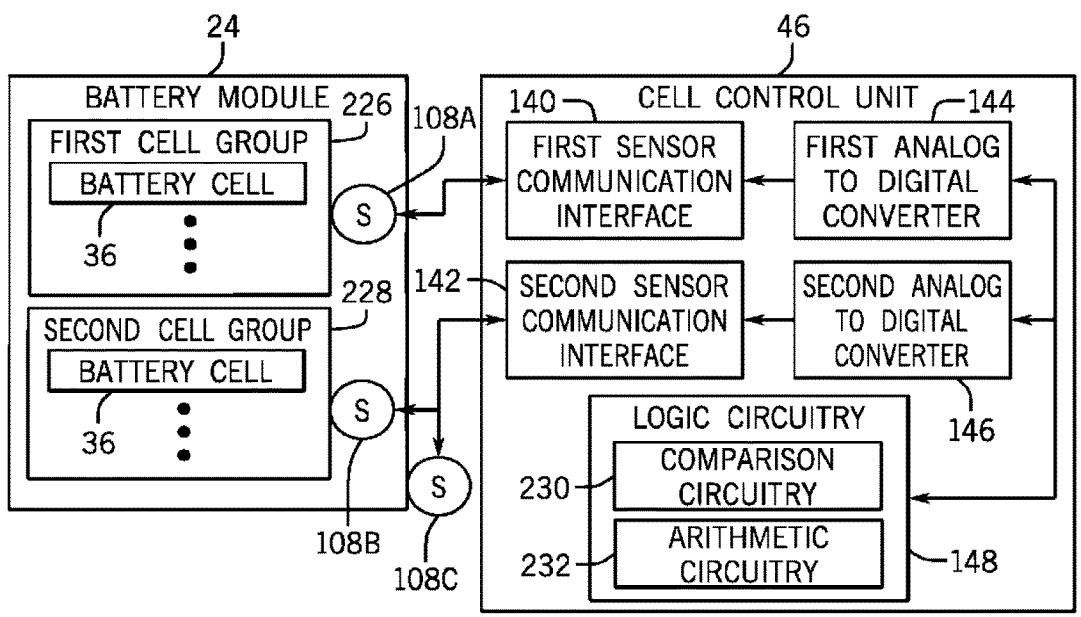
Figure 21:
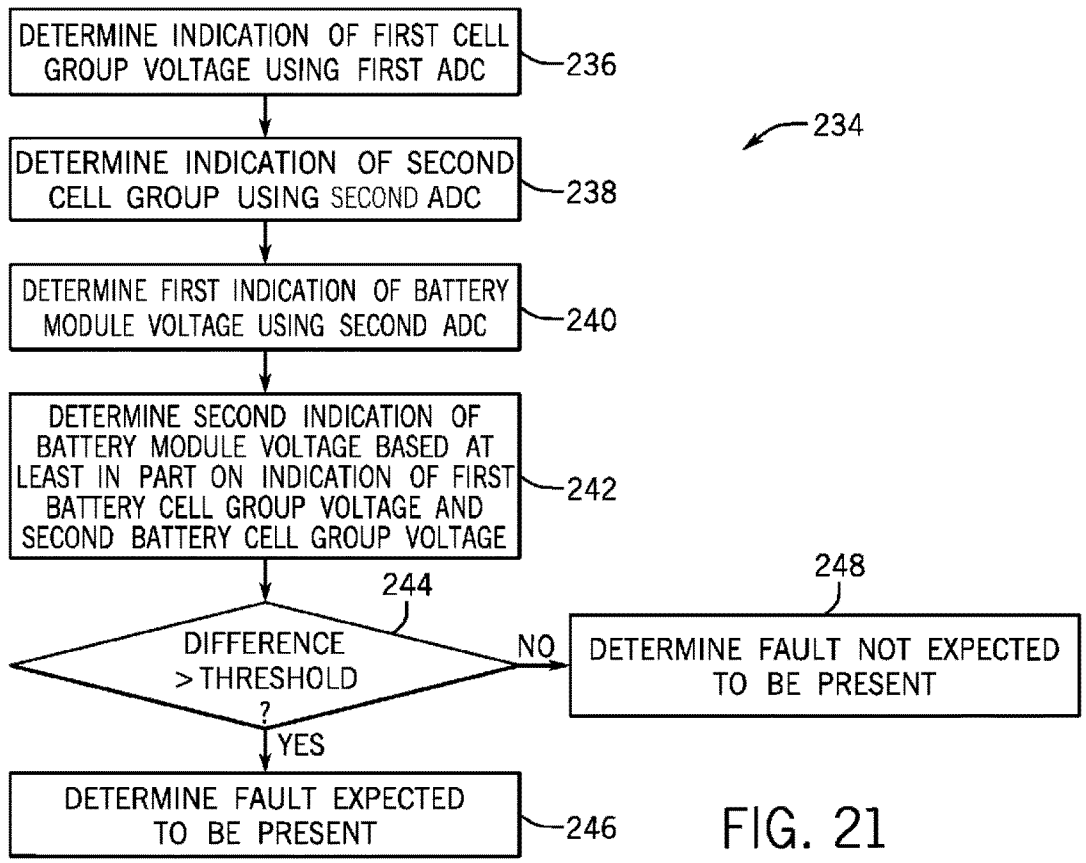

One embodiment of a process 234 for detecting faults using a cell control unit 46 is described in FIG. 21. Generally, the process 234 includes determining an indication of a first cell group voltage using a first analog-to-digital converter (process block 236), determining an indication of a second cell group voltage using a second analog-to-digital converter (process block 238), determining a first indication of a battery module voltage using the second analog-to-digital converter (process block 240), determining a second indication of the battery module voltage based at least in part on the indication of the first cell group voltage and the indication of the second cell group voltage (process block 244), determining whether difference between the first indication of the battery module voltage and the second indication of the battery module voltage is greater than a different threshold (decision block 246), determining that a fault is expected to be present when the difference is greater than the different threshold (process block 246), and determining that a fault is not expected to be present when the different is not greater than the threshold (process block 248). In some embodiments, the process 234 may be implemented by operating the logic circuitry 148 based on circuit connections formed in the logic circuitry 148, for example, during manufacture of the logic circuitry 148.

Accordingly, in some embodiments, the logic circuitry 148 may determine a digital representation of the voltage of the first cell group 226 (process block 236). As described above, in some embodiments, the voltage of the first cell group 226 may be measured by the first sensor 108A and communicated to the first sensor communication interface 140. Additionally, as described above, the measured voltage of the first cell group 226 may be converted to the digital representation of the voltage and communicated to the logic circuitry 148.

Additionally, the logic circuitry 148 may determine a digital representation of the voltage of the second cell group 228 (process block 238). As described above, in some embodiments, the voltage of the second cell group 228 may be measured by the second sensor 108B and communicated to the second sensor communication interface 142. Additionally, as described above, the measured voltage of the second cell group 228 may be converted to the digital representation of the voltage and communicated to the logic circuitry 148.

Furthermore, the logic circuitry 148 may determine a digital representation of the measured voltage of the battery module 24 as a whole (process block 240). As described above, in some embodiments, the voltage of the battery module 24 may be measured by the third sensor 108C and communicated to the second sensor communication interface 142. Additionally, as described above, the measured voltage of the battery module 24 be converted to the digital representation of the voltage and communicated to the logic circuitry 148.

Based at least in part on the digital representation of the first cell group voltage and the digital representation of the second cell group voltage, the logic circuitry 148 may determine a calculated voltage of the battery module 24 (process block 242). In particular, the logic circuitry 148 may use the arithmetic circuitry 232 to determine the calculated voltage by adding together the first cell group voltage and the second cell group voltage.

Additionally, the logic circuitry 148 may determine difference whether difference between the measured voltage of the battery module 24 and the calculated voltage of the battery module 24 is greater than a difference threshold (process block 244). To determine the difference, the logic circuitry 148 may use the arithmetic circuitry 232 to subtract the measured voltage from the calculated voltage or vice versa. Additionally, the logic circuitry 148 may use the comparison circuitry 230 to determine whether the difference is greater than the difference threshold.

In some embodiments, the difference threshold may be predetermined and stored in the circuitry of the logic circuitry 148. In other embodiments, the difference threshold may be supplied to the logic circuitry from a string control unit 50, an integrated string control unit 150, a system control unit 48, a supervisory control system 18, and/or another electrical component, for example, based at least in part on user input. Additionally, in some embodiments, the difference threshold may be set to facilitate detecting faults in one or more specific components of the cell control unit 46, such as the first analog-to-digital converter 144 and/or the second analog-to-digital converter 146. In fact, in some embodiments, various difference thresholds may be used to determine faults in different components of the cell control unit 46 and/or to detect different types of faults in the battery module 24. Furthermore, in some embodiments, the difference threshold may vary based at least in part of the measured battery module voltage and/or the calculated battery module voltage. For example, the different threshold may be a percentage of the measured battery module voltage.

Thus, when the difference is greater than the difference threshold, the logic circuitry 148 may determine that a fault is expected to be present in the cell control unit 46 (process block 246). When a fault is expected to be present, the cell control unit 46 may indicate as much to a string control unit 50, an integrated string control unit 150, a system control unit 48, and/or a supervisory control system 18. In this manner, the hybrid battery control system architectures may specify cell control units 46 that provide fault detection functions even with limited processing capabilities, thereby improving operational reliability while reducing implementation associated cost.

Accordingly, the technical effects of the techniques provided by the present disclosure include improving implementation flexibility and/or reducing implementation associated cost for implementing battery control systems. In some embodiments, a hybrid battery control system architecture may be determined to provide building blocks (e.g., a cell control unit, a string control unit, and a system control unit), which may be used to implement various battery control systems. To determine the hybrid battery control system architecture, some functions to be provided by battery control systems may be centralized into fewer building blocks, thereby reducing redundant infrastructure and, thus, implementation associated cost of the battery control systems. On the other hand, some functions may be distributed to more building blocks, thereby providing various possible control levels that may be used in battery control systems and, thus, improving implementation flexibility. Moreover, the technical effects of the present disclosure may include improving operational reliability of battery control systems by enabling fault detection in cell control units even when the cell control units include limited processing capabilities.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The invention claimed is:

1. A battery system comprising:
a first battery string comprising a first battery module and a second battery module connected in series;
a battery control system configured to control operation of the battery system, wherein the battery control system comprises:
  a first cell control unit electrically coupled to the first battery module, wherein the first cell control unit is configured to determine first module level operational parameters related to operation of the first battery module;
  a first integrated string control unit communicatively coupled to the first cell control unit and electrically coupled to the second battery module, wherein:
    the first integrated string control unit is configured to:
      determine second module level operational parameters related to operation of the second battery module;
      determine first string level operational parameters related to operation of the first battery string based at least in part on the first module level operational parameters and the second module level operational parameters; and
      control operation of the first battery string based at least in part on the first string level operational parameters; and
    the first integrated string control unit comprises:
      an integrated cell control unit configured to operate using first high voltage electrical power received from the second battery module and to determine the second module level operational parameters based at least in part on the first high voltage electrical power;
      a communication interface configured to operate using low voltage electrical power received from an external power source;
      processing circuitry and a processing unit configured to operate using second high voltage electrical power; and
      an isolation barrier formed to electrically isolate the processing circuitry and the processing unit from the communication interface, wherein the isolation barrier comprises:
        an isolated communication interface configured to communicatively couple the processing circuitry and the processing unit with the communication interface through the isolation barrier; and
        a transformer configured to receive the low voltage electrical power form the external power source and generate the second high voltage electrical power supplied to the processing circuitry and the processing unit based at least in part on the low voltage electrical power.

2. The battery system of claim 1, wherein:
the first battery string comprises a third battery module connected in series with the first battery module and the second battery module; and
the battery control system comprises a second cell control unit electrically coupled to the third battery module and communicatively coupled to the first integrated string control unit, wherein the second cell control unit is configured to determine third module level operational parameters related to operation of the third battery module; and
the first integrated string control unit is configured to determine the first string level operational parameters based at least in part on the third module level operational parameters.

3. The battery system of claim 1, comprising a second battery string, wherein:
the second battery string comprises a third battery module and a fourth battery module connected in series; and
the battery control system comprises:
  a second cell control unit electrically coupled to the third battery module, wherein the second cell control unit is configured to determine third module level operational parameters related to operation of the third battery module; and
  a second integrated string control unit communicatively coupled to the second cell control unit and electrically coupled to the fourth battery module, wherein the second integrated string control unit is configured to:
    determine fourth module level operational parameters related to operation of the fourth battery module;
    determine second string level operational parameters related to operation of the second battery string based at least in part on the third module level operational parameters and the fourth module level operational parameters; and
    control operation of the second battery string based at least in part on the second string level operational parameters.

4. The battery system of claim 3, comprising:
a positive bus and a negative bus configured to electrically couple the battery system to an electrical load, an electrical source, or both; and
a battery chain comprising the first battery string and the second battery string connected in series between the positive bus and the negative bus;
wherein the second integrated string control unit is communicatively coupled to the first integrated string control unit via a serial communication network.

5. The battery system of claim 3, wherein:
the second integrated string control unit is configured to determine whether a fault is detected in the second battery string; and
the first integrated string control unit is configured to instruct a relay to disconnect the battery chain from the battery system.

6. The battery system of claim 1, wherein the processing circuitry and the processing unit are configured to receive the second high voltage electrical power from the battery string when supply of the low voltage electrical power to the first integrated string control unit is disrupted.

7. The battery system of claim 1, wherein:
the first battery module comprises a first battery cell group and a second battery cell group, wherein the first battery cell group comprises a first plurality of battery cells and the second battery cell group comprises a second plurality of battery cells;
the first cell control unit, to determine the first module level operational parameters, is configured to:
determine a first cell group voltage of the first battery cell group;
determine a second cell group voltage of the second battery cell group; and
determine a first battery module voltage of the first battery module;
the second battery module comprises a third battery cell group and a fourth battery cell group, wherein the third battery cell group comprises a third plurality of battery cells and the fourth battery cell group comprises a fourth plurality of battery cells;
the first integrated string control unit, to determine the second module level operational parameters, is configured to:
determine a third cell group voltage of the third battery cell group;
determine a fourth cell group voltage of the fourth battery cell group; and
determine a second battery module voltage of the second battery module; and
the first integrated string control unit, to determine the first string level operational parameters, is configured to
determine a string voltage of the first battery string based at least in part on the first cell group voltage, the second cell group voltage, the first battery module voltage, the third cell group voltage, the fourth cell group voltage, the second battery module voltage, or any combination thereof; and
determine a string current of the first battery string based at least in part on electrical power supplied to the first integrated string control unit from the first battery string.

8. The battery system of claim 1, wherein:
the first battery module comprises:
a first plurality of battery cells; and
a first housing configured to house the first plurality of battery cells, wherein the first cell control unit is disposed directly on a first surface of the first housing;
the second battery module comprises:
a second plurality of battery cells; and
a second housing configured to house the second plurality of battery cells, wherein the first integrated string control unit is disposed directly on a second surface of the second housing.

9. A method for implementing a battery control system used to control operation of a battery system, comprising:
implementing a first cell control unit by electrically coupling the first cell control unit to a first terminal of a first battery module in the battery system to enable the first cell control unit to receive first high voltage electrical power from the first battery module and to determine first operational parameters related to operation of the first battery module; and
implementing a first integrated string control unit by:
electrically coupling the first integrated string control unit to a second terminal of a second battery module in the battery system to enable the first integrated string control unit to receive second high voltage electrical power from a first battery string and to determine second operational parameters related to operation of the second battery module, wherein the first battery string comprises the first battery module and the second battery module connected in series; and
communicatively coupling the first integrated string control unit to the first cell control unit via a first high voltage serial communication network to enable the first integrated string control unit to determine third operational parameters related to operation of the first battery string based at least in part on the first operational parameters and to determine control commands instructing the battery system to adjust operation of the first battery string.

10. The method of claim 9, wherein:
implementing the first cell control unit comprises:
communicatively coupling a first analog-to-digital converter to a first sensor communication interface to enable the first cell control unit to receive a first analog representation of first sensor data from a first sensor and to generate a first digital representation of the first sensor data;
communicatively coupling logic circuitry to the first analog-to-digital converter to enable the logic circuitry to perform a logic operation, an arithmetic operation, or both based at least in part on the first digital representation of the first sensor data; and
communicatively coupling a first serial communication interface to the logic circuitry to enable the first cell control unit to communicate data with the first integrated string control unit via the first high voltage serial communication network; and
implementing the first integrated string control unit comprises:
communicatively coupling a second analog-to-digital converter to a second sensor communication interface to enable the first integrated string control unit to receive a second analog representation of second sensor data from a second sensor and to generate a second digital representation of the second sensor data; and
communicatively coupling processing circuitry, a processing unit, or both to the second analog-to-digital converter to enable the first integrated string control unit to determine the third operational parameters, determine the control commands, or both based at least in part on the second digital representation.

11. The method of claim 10, wherein implementing the first integrated string control unit comprises:
communicatively coupling a first communication interface to the processing circuitry, the processing unit, or both to enable the first integrated string control unit to communicate data with the first cell control unit via the first high voltage serial communication network;
forming an isolation barrier to electrically isolate the processing circuitry, the processing unit, and the first communication interface from a second communication interface, wherein the isolation barrier comprises an isolated communication interface;
communicatively coupling the processing circuitry, the processing unit, or both to a first end of the isolated communication interface; and
communicatively coupling the second communication interface to a second end of the isolated communication interface to enable the first integrated string control unit to communicate data within the battery control system via a low voltage serial communication network, a low voltage parallel communication network, or both.

12. The method of claim 10, wherein implementing the first integrated string control unit comprises:
forming an isolation barrier comprising a transformer;
electrically coupling a low voltage power source to a first end of the transformer to enable the transformer to receive low voltage electrical power from the low voltage power source; and
electrically coupling the processing circuitry, the processing unit, or both to a second end of the transformer to enable the transformer to generate a third high voltage electrical power supplied to operate the processing circuitry, the processing unit, or both.

13. The method of claim 9, comprising implementing a second cell control unit by electrically coupling the second cell control unit to a third terminal of a third battery module to enable the second cell control unit to receive third high voltage electrical power from the third battery module and to determine fourth operational parameters related to operation of the third battery module, wherein the first battery string comprises the third battery module connected in series with the first battery module and the second battery module;
wherein implementing the first integrated string control unit comprises communicatively coupling the first integrated string control unit to the second cell control unit via the first high voltage serial communication network to enable the first integrated string control unit to determine the third operational parameters based at least in part on the fourth operational parameters.

14. The method of claim 9, comprising:
implementing a second cell control unit by electrically coupling the second cell control unit to a third terminal of a third battery module in the battery system to enable the second cell control unit to receive third high voltage electrical power from the third battery module and to determine fourth operational parameters related to operation of the third battery module; and
implementing a second integrated string control unit by:
electrically coupling the second integrated string control unit to a fourth terminal of a fourth battery module in the battery system to enable the second integrated string control unit to receive fourth high voltage electrical power from a second battery string and to determine fifth operational parameters related to operation of the fourth battery module, wherein the second battery string comprises the third battery module and the fourth battery module connected in series; and
communicatively coupling the second integrated string control unit to the second cell control unit via a second high voltage serial communication network to enable the second integrated string control unit to determine sixth operational parameters related to operation of the second battery string based at least in part on the fourth operational parameters.

15. The method of claim 14, comprising:
implementing a chain control unit by coupling the chain control unit to the first integrated string control unit to enable the chain control unit to determine seventh operational parameters of a battery chain, wherein the battery chain comprises the first battery string and the second battery string connected in series; and
implementing a system control unit by communicatively coupling the system control unit to the first integrated string control unit and the second integrated string control unit via a parallel communication network;
wherein implementing the second integrated string control unit comprises communicatively coupling the second integrated string control unit to the first integrated string control unit via a low voltage serial communication network.

16. The method of claim 9, wherein implementing the first integrated string control unit comprises electrically coupling the first integrated string control unit to the second terminal of the second battery module to enable the first integrated string control unit to determine current flowing in the first battery string.

17. A tangible, non-transitory, computer-readable medium that stores instructions executable by one or more processors of a design system, wherein the instructions comprise instructions to:
determine, using the one or more processors, a battery control system architecture that specifies building blocks used to implement a battery control system in a battery system, wherein the building blocks comprise a cell control unit and an integrated string control unit;
determine, using the one or more processors, number of battery modules in a battery string of the battery system, wherein the battery string comprises one or more battery modules connected in series;
indicating, using the one or more processors, the integrated string control unit to be electrically coupled to a first battery module in the battery string to enable the integrated string control unit to determine a first battery module voltage and a battery string voltage based at least in part on the first battery module voltage; and
indicating, using the one or more processors, the cell control unit to be electrically coupled to a second battery module in the battery string to enable the cell control unit to determine a second battery module voltage only when the battery string comprises multiple battery modules.

18. The computer-readable medium of claim 17, comprising indicating, using the one or more processors, the cell control unit to be communicatively coupled to the integrated string control unit to enable the integrated string control unit to determine the battery string voltage based at least in part on the second battery module voltage only when the battery string comprises multiple battery modules.

19. The computer-readable medium of claim 17, comprising indicating, using the one or more processors, the integrated string control module to be physically coupled to a housing of the first battery module.

20. A battery system comprising:
a first battery string comprising a first battery module and a second battery module connected in series;
a battery control system configured to control operation of the battery system, wherein the battery control system comprises:
a first cell control unit electrically coupled to the first battery module, wherein the first cell control unit is configured to determine first module level operational parameters related to operation of the first battery module;
a first integrated string control unit communicatively coupled to the first cell control unit and electrically coupled to the second battery module, wherein:
the first integrated string control unit is configured to:

determine second module level operational parameters related to operation of the second battery module;

determine first string level operational parameters related to operation of the first battery string based at least in part on the first module level operational parameters and the second module level operational parameters; and control operation of the first battery string based at least in part on the first string level operational parameters; and the first integrated string control unit comprises:

a parallel communication interface configured to communicatively couple the first integrated string control unit to a second integrated string control unit and a system control unit via a parallel communication network;

a low voltage serial communication interface configured to communicatively couple the first integrated string control unit to the second integrated string control unit and the system control unit via a low voltage serial communication network;

a high voltage serial communication interface configured to communicatively couple the first integrated string control unit to the first cell control unit via a high voltage serial communication network; and an isolation barrier configured to electrically isolate the parallel communication interface and the low voltage serial communication interface from the high voltage serial communication interface.

\* \* \* \* \*

UNITED STATES PATENT AND TRADEMARK OFFICE
CERTIFICATE OF CORRECTION

PATENT NO. : 10,148,102 B2
APPLICATION NO. : 15/253463
DATED : December 4, 2018
INVENTOR(S) : Ronald J. Dulle et al.

It is certified that error appears in the above-identified patent and that said Letters Patent is hereby corrected as shown below:

In the Drawings

Please replace FIGS. 2-3, 12-13, and 20-21 with FIGS. 2-3, 12-13, and 20-21 as shown on the attached pages.

In the Specification

In Column 4, Lines 66 and 67, delete "analog-to-digital (ADC) converter," and insert -- analog-to-digital converter (ADC), --, therefor.

In Column 5, Line 28, delete "that that" and insert -- that --, therefor.

In Column 5, Line 37, delete "DRAWINGS" and insert -- BRIEF DESCRIPTION OF THE DRAWINGS --, therefor.

In Column 5, Line 44, delete "is block" and insert -- is a block --, therefor.

In Column 5, Line 48, delete "electrical system battery system of claim 1" and insert -- electrical system and the battery system of FIG. 1 --, therefor.

In Column 5, Line 61, delete "FIG. 6," and insert -- FIG. 5, --, therefor.

In Column 6, Line 49, delete "embodiment." and insert -- embodiment of the present disclosure. --, therefor.

In Column 9, Line 38, delete "be communicatively" and insert -- be communicatively coupled --, therefor.

In Column 10, Lines 44 and 45, delete "analog-to-digital (ADC) converter," and insert -- analog-to-digital converter (ADC), --, therefor.

Signed and Sealed this
Fifth Day of November, 2019

Andrei Iancu
*Director of the United States Patent and Trademark Office*

CERTIFICATE OF CORRECTION (continued)
U.S. Pat. No. 10,148,102 B2

In Column 11, Lines 42 and 43, delete "field programmable logic arrays" and insert -- field programmable gate arrays --, therefor.

In Column 12, Line 27, delete "field programmable logic arrays" and insert -- field programmable gate arrays --, therefor.

In Column 12, Line 57, delete "to be help" and insert -- to help --, therefor.

In Column 13, Line 8, delete "addition the" and insert -- addition to the --, therefor.

In Column 13, Line 12, delete "may additional" and insert -- may additionally --, therefor.

In Column 13, Line 31, delete "other that" and insert -- other than --, therefor.

In Column 16, Line 43, delete "output device 62" and insert -- output device 64 --, therefor.

In Column 16, Line 62, delete "field programmable logic arrays" and insert -- field programmable gate arrays --, therefor.

In Column 21, Line 17, delete "(process block 106)" and insert -- (process block 104 --, therefor.

In Column 22, Line 39, delete "battery system 26" and insert -- battery control system system 26 --, therefor.

In Column 22, Line 64, delete "barriers 56 cell" and insert -- barrier 56 in cell --, therefor.

In Column 25, Line 57, delete "string control unit SOL" and insert -- string control unit 50L --, therefor.

In Column 26, Lines 48 and 49, delete "field programmable logic arrays" and insert -- field programmable gate arrays --, therefor.

In Column 27, Line 16, delete "cell control units 50" and insert -- cell control units 46 --, therefor.

In Column 27, Line 17, delete "cell control units 50" and insert -- cell control units 46 --, therefor.

In Column 27, Line 38, delete "cell control units 48" and insert -- cell control units 46 --, therefor.

In Column 30, Line 47, delete "may communication" and insert -- may communicate --, therefor.

In Column 31, Line 41, delete "may be may be" and insert -- may be --, therefor.

In Column 32, Lines 16 and 17, delete "field programmable logic arrays" and insert -- field programmable gate arrays --, therefor.

In Column 34, Line 40, delete "cell control units 48" and insert -- cell control units 46 --, therefor.

In Column 34, Line 62, delete "communicatively the" and insert -- communicatively coupling the --, therefor.

In Column 36, Line 37, delete "illustrate example" and insert -- illustrative example --, therefor.

In Column 36, Line 44, delete "string control unit SOL" and insert -- string control unit 50L --, therefor.

In Column 36, Lines 64 and 65, delete "string control unit SOL" and insert -- string control unit 50L --, therefor.

In Column 36, Lines 65 and 66, delete "string control unit SOL" and insert -- string control unit 50L --, therefor.

In Column 37, Lines 7 and 8, delete "string control unit SOL" and insert -- string control unit 50L --, therefor.

In Column 38, Line 51, delete "has be" and insert -- has been --, therefor.

In Column 38, Line 60, delete "the a battery module" and insert -- the battery module --, therefor.

In Column 39, Line 14, delete "does not determined" and insert -- does not determine --, therefor.

In Column 40, Lines 33 and 34, delete "string control unit SOL" and insert -- string control unit 50L --, therefor.

In Column 40, Line 35, delete "string control unit SOL" and insert -- string control unit 50L --, therefor.

In Column 40, Lines 37 and 38, delete "string control unit SOL" and insert -- string control unit 50L --, therefor.

In Column 40, Line 43, delete "string control unit SOL" and insert -- string control unit 50L --, therefor.

In Column 41, Line 49, delete "string control unit SOL" and insert -- string control unit 50L --, therefor.

In Column 41, Lines 57 and 58, delete "plot 224 includes a third waveform 222" and insert -- plot 218 includes a third waveform 224 --, therefor.

In Column 41, Line 60, delete "string control unit SOL" and insert -- string control unit 50L --, therefor.

In Column 41, Line 61, delete "With regarding" and insert -- With regard --, therefor.
In Column 42, Line 1, delete "string control unit SOL" and insert -- string control unit 50L --, therefor.

In Column 42, Lines 13 and 14, delete "string control unit SOL" and insert -- string control unit 50L --, therefor.

In Column 42, Lines 48 and 49, delete "communicatively to" and insert -- communicatively coupled to --, therefor.

In Column 43, Line 32, delete "different" and insert -- difference --, therefor.